US009123657B2

(12) United States Patent
Park et al.

(10) Patent No.: US 9,123,657 B2
(45) Date of Patent: Sep. 1, 2015

(54) METHOD OF FABRICATING SEMICONDUCTOR DEVICES

(71) Applicant: Samsung Electronics Co., Ltd., Suwon-si (KR)

(72) Inventors: Minjoon Park, Yongin-si (KR); Junho Yoon, Suwon-si (KR); Je-Woo Han, Hwaseong-si (KR); Chan-Won Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/326,960

(22) Filed: Jul. 9, 2014

(65) Prior Publication Data
US 2015/0079791 A1 Mar. 19, 2015

(30) Foreign Application Priority Data

Sep. 16, 2013 (KR) .................. 10-2013-0111393

(51) Int. Cl.
*H01L 21/76* (2006.01)
*H01L 21/308* (2006.01)
*H01L 49/02* (2006.01)

(52) U.S. Cl.
CPC ........ *H01L 21/3086* (2013.01); *H01L 21/3085* (2013.01); *H01L 28/40* (2013.01)

(58) Field of Classification Search
None
See application file for complete search history.

(56) References Cited

U.S. PATENT DOCUMENTS

| 6,043,133 | A * | 3/2000 | Jang et al. .............. 438/401 |
| 6,440,753 | B1 | 8/2002 | Ning et al. |
| 6,468,898 | B1 | 10/2002 | Usami |
| 6,930,048 | B1 | 8/2005 | Li et al. |
| 6,969,685 | B1 | 11/2005 | Li et al. |
| 7,052,621 | B2 | 5/2006 | Kumar et al. |
| 7,064,044 | B2 | 6/2006 | Chen et al. |
| 7,465,604 | B2 | 12/2008 | Heo |
| 7,709,336 | B2 | 5/2010 | Ning et al. |
| 7,723,203 | B2 | 5/2010 | Kim |
| 8,426,319 | B2 | 4/2013 | Mistkawi et al. |
| 8,513,114 | B2 | 8/2013 | Tagami |
| 2002/0098676 | A1 | 7/2002 | Ning et al. |
| 2003/0052440 | A1* | 3/2003 | Tsuura .............. 267/100 |
| 2004/0251234 | A1 | 12/2004 | Kumar et al. |
| 2005/0277287 | A1 | 12/2005 | Chen et al. |
| 2006/0001065 | A1 | 1/2006 | Heo |
| 2006/0194395 | A1 | 8/2006 | Ning et al. |
| 2007/0018341 | A1 | 1/2007 | Hsieh et al. |
| 2007/0072386 | A1 | 3/2007 | Kim |

(Continued)

FOREIGN PATENT DOCUMENTS

KR 10-2005-0104088 A 11/2005
KR 10-2006-0134344 A 12/2006

(Continued)

*Primary Examiner* — Alexander Ghyka
(74) *Attorney, Agent, or Firm* — Sughrue Mion, PLLC

(57) ABSTRACT

A method of fabricating a semiconductor device is provided. The method may include forming an interlayer insulating layer on a structure with a cell region and a peripheral circuit region, forming a first mask layer on the interlayer insulating layer, forming trenches in the first mask layer exposing the interlayer insulating layer by patterning the first mask layer on the peripheral circuit region, and forming key mask patterns in the trenches. An etch selectivity of the first mask patterns with respect to the interlayer insulating layer may be greater than that of the key mask patterns with respect to the interlayer insulating layer.

20 Claims, 23 Drawing Sheets

(56) References Cited

U.S. PATENT DOCUMENTS

| | | |
|---|---|---|
| 2007/0152216 A1* | 7/2007 | Lin et al. .................. 257/48 |
| 2008/0023736 A1* | 1/2008 | Kim .......................... 257/292 |
| 2008/0318435 A1 | 12/2008 | Mistkawi et al. |
| 2009/0061590 A1* | 3/2009 | Hwang ..................... 438/401 |
| 2010/0330728 A1* | 12/2010 | McCarten et al. ....... 438/70 |
| 2011/0266032 A1* | 11/2011 | Xie et al. ................. 174/250 |
| 2012/0276735 A1 | 11/2012 | Tagami |
| 2013/0161722 A1* | 6/2013 | Son et al. ................. 257/321 |
| 2013/0214337 A1* | 8/2013 | Kashihara ................ 257/294 |
| 2014/0051246 A1* | 2/2014 | Kim et al. ................ 438/666 |
| 2014/0206162 A1* | 7/2014 | Eguchi et al. ........... 438/268 |
| 2014/0242758 A1* | 8/2014 | Kang et al. .............. 438/113 |
| 2014/0264631 A1* | 9/2014 | Wei et al. ................. 257/401 |

FOREIGN PATENT DOCUMENTS

| | | |
|---|---|---|
| KR | 10-2008-0060385 A | 7/2008 |
| KR | 10-2009-0019133 A | 2/2009 |

* cited by examiner

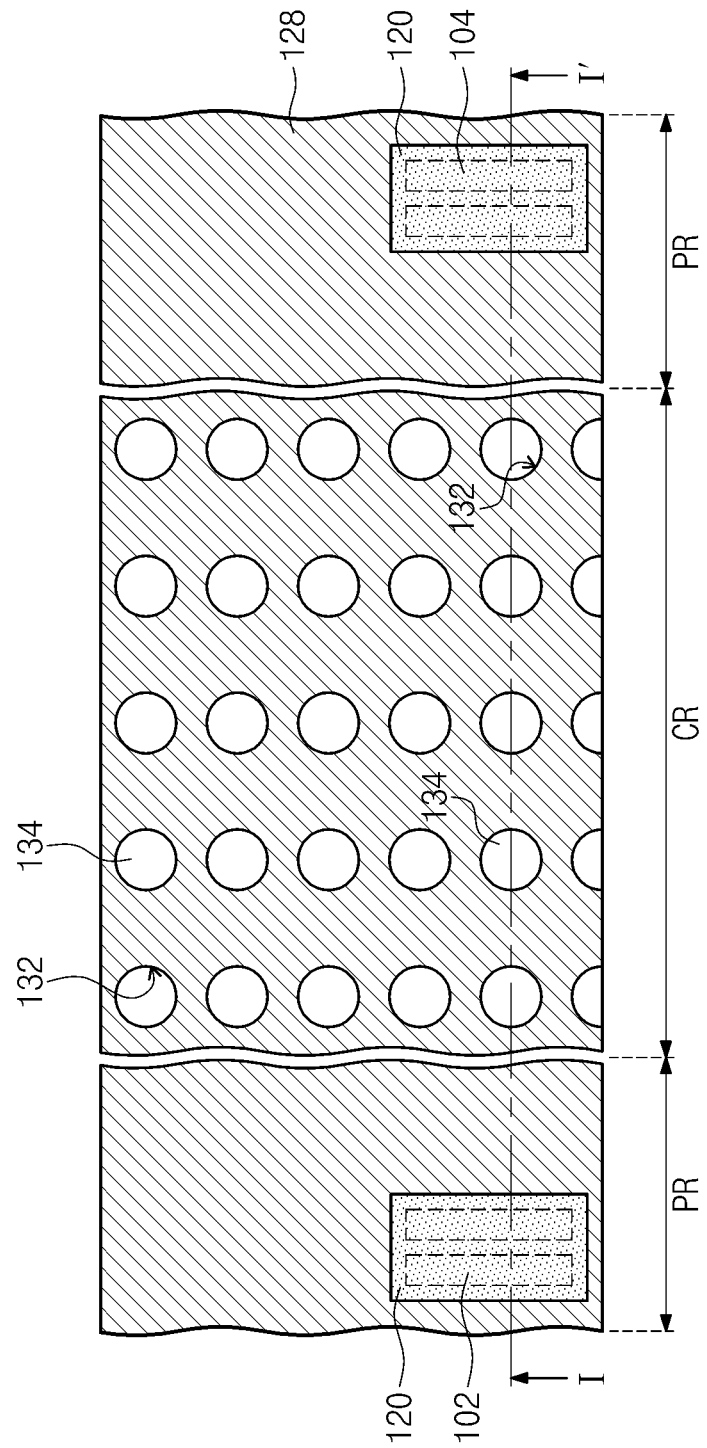

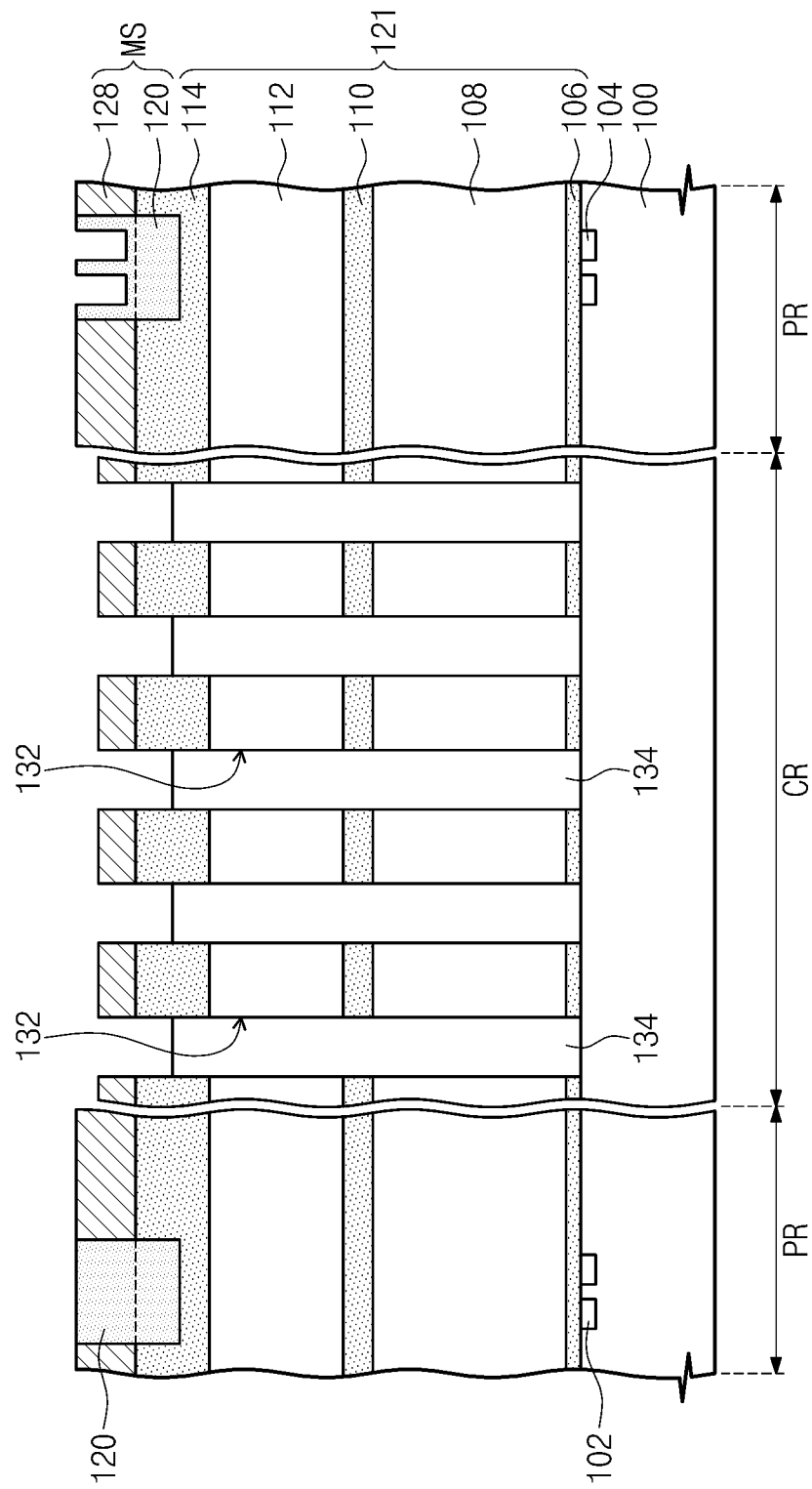

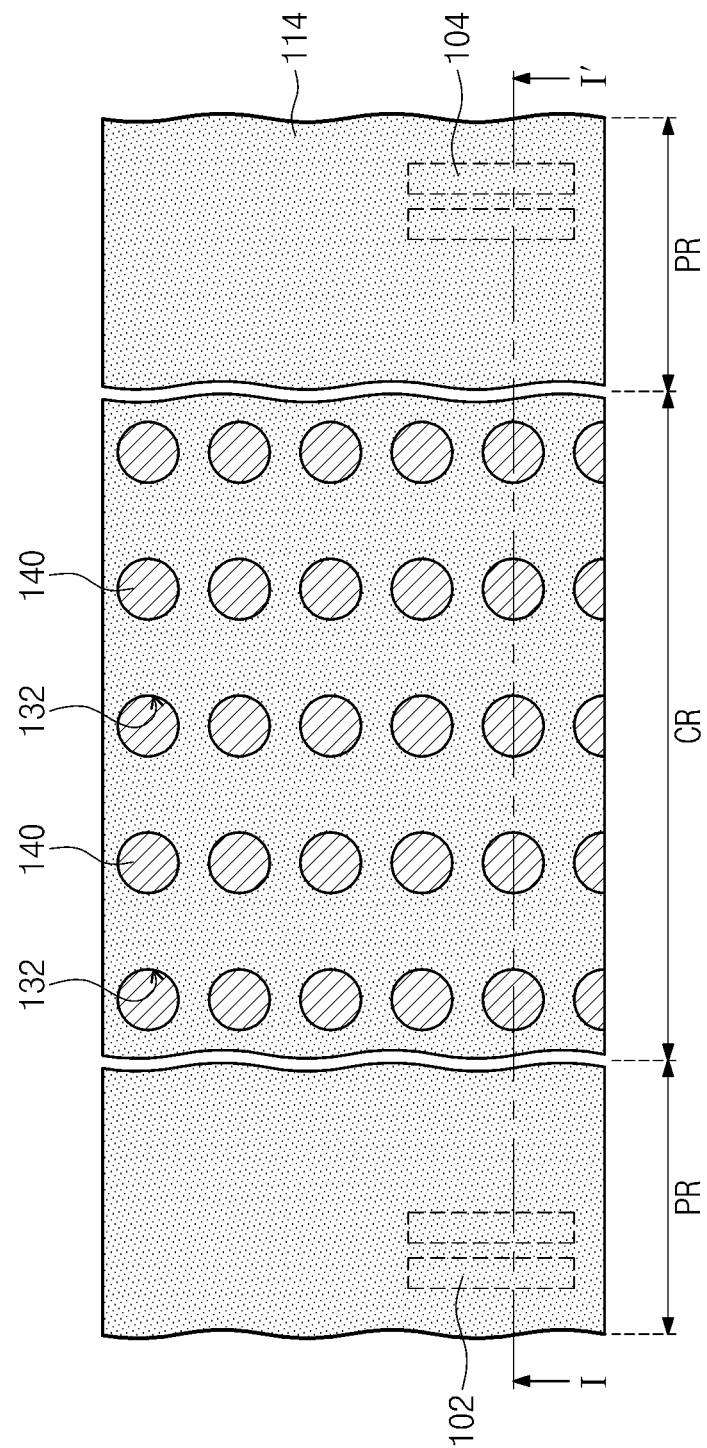

METHOD OF FABRICATING SEMICONDUCTOR DEVICES

CROSS-REFERENCE TO RELATED APPLICATION

This application claims priority from Korean Patent Application No. 10-2013-0111393, filed on Sep. 16, 2013, in the Korean Intellectual Property Office, the entire contents of which are hereby incorporated by reference.

BACKGROUND

1. Field

Methods consistent with exemplary embodiments relate to fabricating a semiconductor device and more particularly, fabricating a semiconductor device including a capacitor.

2. Description of Related Art

As semiconductor devices become more highly integrated, a capacitor having sufficient capacitance in a limited area is advantageous. The capacitance of a capacitor is proportional to a surface area of an electrode and a dielectric constant of dielectric film and is inversely proportional to an equivalent oxide thickness of the dielectric film. In methods for increasing the capacitance of a capacitor in a limited area, a surface area of an electrode may be increased by forming a capacitor of a three dimensional structure, an equivalent oxide thickness of dielectric film may be reduced and a dielectric film having a high dielectric constant may be used.

In methods that increase the surface area of electrode, a height of a lower electrode (or a storage electrode) may be increased, an effective surface area of a lower electrode using a hemi-spherical grain (HSG) may be enlarged and an inside area and an outside area of cylinder using one cylinder storage (OCS) electrode may be used. As a dielectric film having a high dielectric constant, there may be a metal oxide film such as $TiO_2$ and $Ta_2O_5$ or a ferroelectric of perovskite structure.

SUMMARY

Exemplary embodiments provide methods capable of fabricating a semiconductor device with an increased process margin.

According to an aspect of an exemplary embodiment, there is provided a method of fabricating a semiconductor device, the method including forming an interlayer insulating layer on a lower structure with a cell region and a peripheral circuit region, forming a first mask layer on the interlayer insulating layer, forming trenches exposing the interlayer insulating layer by patterning the first mask layer on the peripheral circuit region to, and forming key mask patterns in the trenches. An etch selectivity of the first mask layer with respect to the interlayer insulating layer may be greater than that of the key mask patterns with respect to the interlayer insulating layer.

The forming the key mask patterns may include forming a second mask layer on the first mask layer to fill the trenches, and planarizing the second mask layer to expose the first mask layer.

An optical transmittance of the key mask patterns may be higher than that of the first mask layer.

The first mask layer may include a metal layer.

The first mask layer may include at least one of Al, Sc, Ti, Cr, Ni, Cu, Zn, Zr, Mo, Ru, Hf, Ta, W, Pt, La, or, any alloys thereof.

The key mask patterns may be formed of a silicon layer.

The key mask patterns may be formed of a doped silicon layer.

The forming the trenches may include patterning the first mask layer to form first portions exposing a top surface of the interlayer insulating layer, and etching an upper portion of the interlayer insulating layer exposed by the first portions to form second portions. The trenches may be formed in such a way that bottom surfaces thereof are positioned below a bottom surface of the first mask layer.

The key mask patterns may be thicker than the first mask layer.

The method may further include forming alignment keys and first overlay keys in the lower structure on the peripheral circuit region. Forming the trenches includes removing portions of the first mask layer that are overlapped with the alignment keys and the first overlay keys when viewed in plan view.

The method may further include forming alignment keys and first overlay keys in the lower structure on the peripheral circuit region. The key mask patterns may be formed in such a way that they are overlapped with the alignment keys and the first overlay keys, when viewed in plan view.

The method may further include forming second overlay keys on the key mask patterns. The second overlay keys may be overlapped with the first overlay keys, when viewed in plan view, and be vertically spaced apart from the first overlay keys by the key mask patterns interposed therebetween.

The method may include patterning the first mask layer of the cell region to form first mask patterns having openings exposing the interlayer insulating layer, after forming the key mask patterns, etching the interlayer insulating layer using the first mask patterns as an etch mask to form holes exposing the lower structure, and then, removing the first mask patterns and the key mask patterns.

The forming the holes includes etching the interlayer insulating layer, under an etching condition capable of providing an etch selectivity with respect to the first mask patterns and the key mask patterns.

The removing the first mask patterns and the key mask patterns may include forming sacrificial patterns to fill the holes, etching the first mask patterns and the key mask patterns to expose the interlayer insulating layer, and removing the sacrificial patterns.

BRIEF DESCRIPTION OF THE DRAWINGS

The above and/or other aspects will be more clearly understood from the following description of exemplary embodiments taken in conjunction with the accompanying drawings in which:

FIGS. 2A through 11A are plan views illustrating a method of fabricating a semiconductor device, according to an exemplary embodiment;

FIGS. 2B through 11B are sectional views taken along line I-I' of FIGS. 2A through 11A, respectively;

DETAILED DESCRIPTION

Figure 1:
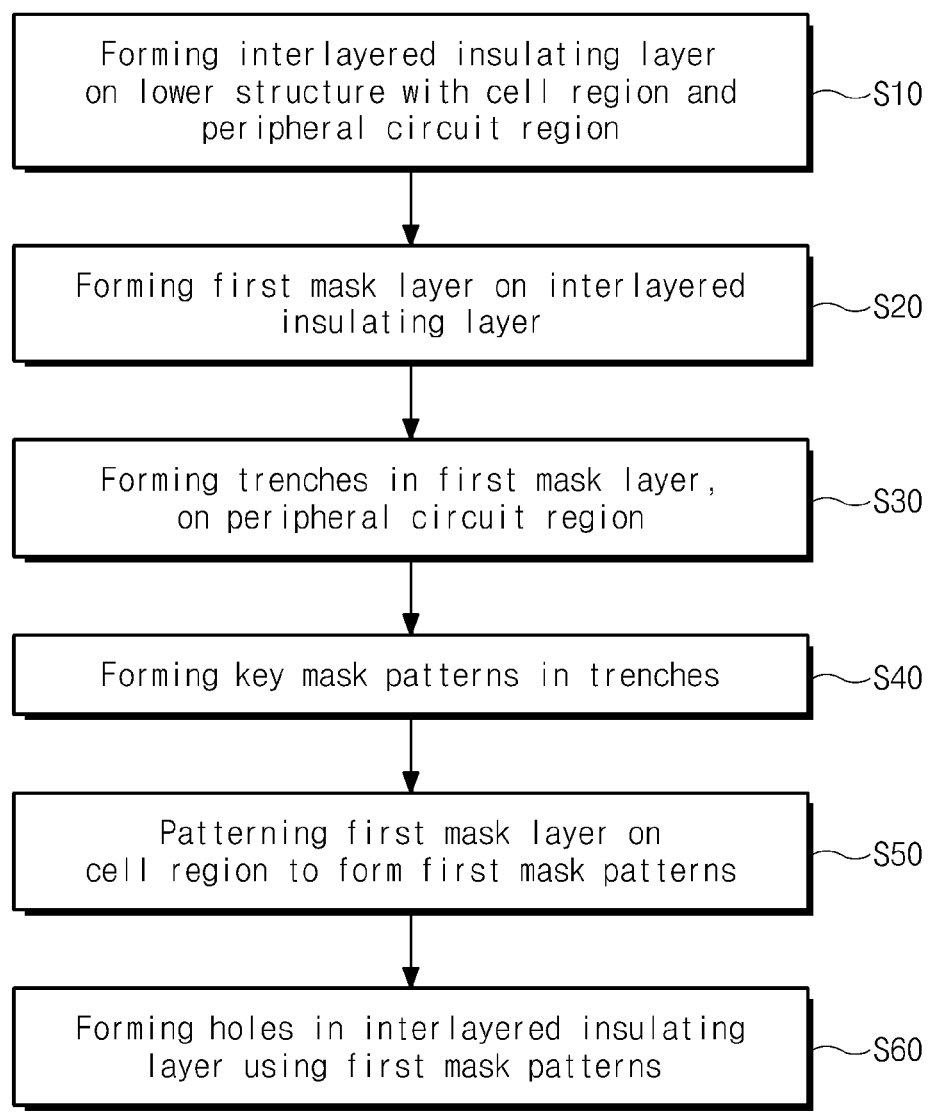
FIG. 1 is a flow chart illustrating a method of fabricating a semiconductor device, according to an exemplary embodiment.

Exemplary embodiments will now be described more fully with reference to the accompanying drawings, in which various exemplary embodiments are shown. The exemplary embodiments may, however, be embodied in many different forms and should not be construed as being limited to the exemplary embodiments set forth herein; rather, the described exemplary embodiments are provided so that this disclosure will be thorough and complete, and will fully convey the concept of the inventive concept to those of ordinary skill in the art.

In the drawings, like reference numerals denote like elements, and thus their description will be omitted. It should be noted that the figures provided herewith are intended to illustrate the general characteristics of methods, structures and/or materials used in certain exemplary embodiments and to supplement the written description provided below. The drawings are not, however, to scale and may not precisely reflect the precise structural or performance characteristics of any given exemplary embodiment, and should not be interpreted as defining or limiting the range of values or properties encompassed by the exemplary embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature. The accompanying drawings represent non-limiting, exemplary embodiments as described herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a similar fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. In other words, the device may be otherwise reoriented (e.g., rotated 90 degrees or at other orientations) and the spatially relative descriptors used herein interpreted accordingly.

The terminology used herein is for the purpose of describing particular exemplary embodiments only and is not intended to be limiting of the exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures) of the exemplary embodiments. As such, variations from the shapes of the illustrations as a result, for example, of manufacturing techniques and/or tolerances, are to be expected. Thus, the exemplary embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a flow chart illustrating a method of fabricating a semiconductor device, according to an exemplary embodiment. FIGS. 2A through 11A are plan views illustrating a method of fabricating a semiconductor device, according to an exemplary embodiment, and FIGS. 2B through 11B are sectional views taken along line I-I' of FIGS. 2A through 11A, respectively.

Figure 2A:
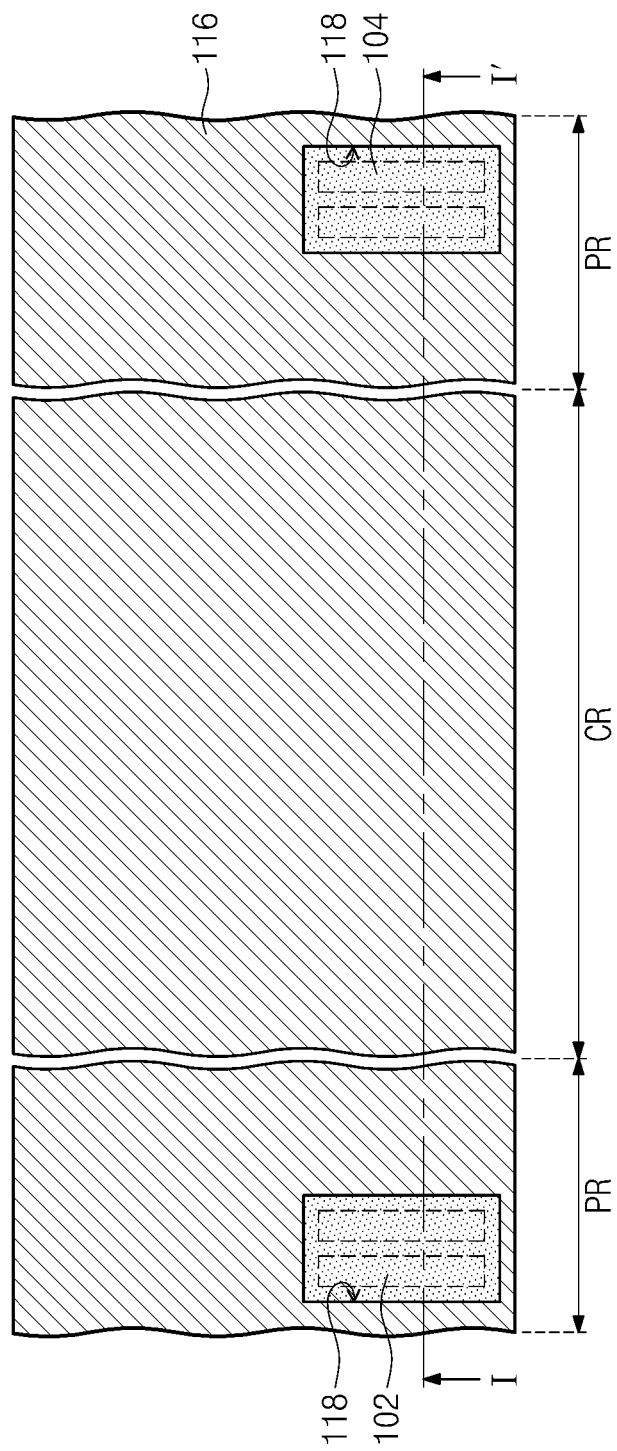
Figure 2B:
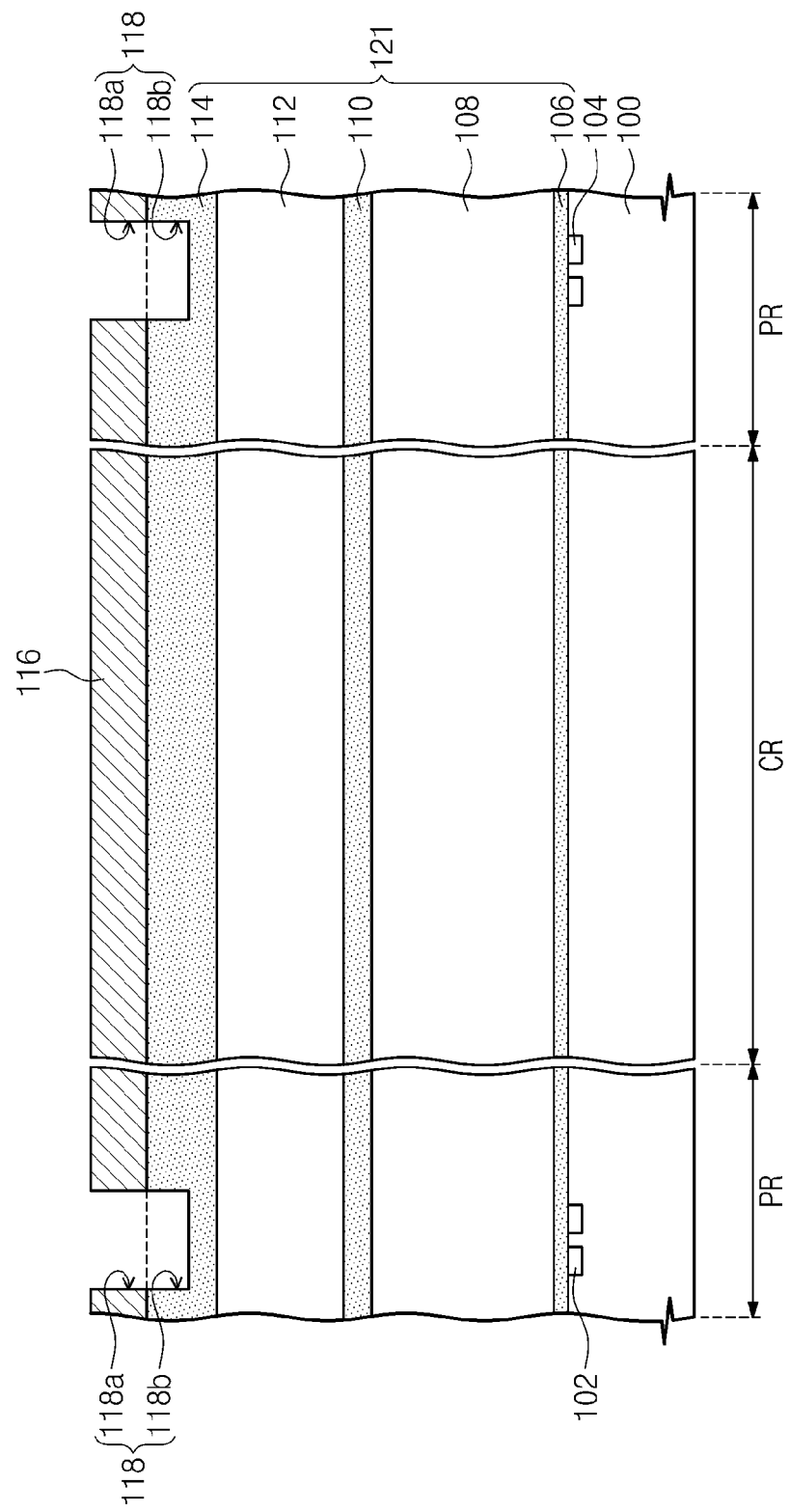

Referring to FIGS. 1, 2A, and 2B, an interlayer insulating layer 121 may be formed on a lower structure 100 having a cell region CR and a peripheral region PR (S10). The lower structure 100 may include a semiconductor substrate, semiconductor devices, and insulating layers. For example, the semiconductor substrate may be or include a silicon wafer, a germanium wafer, or a silicon-germanium wafer.

As shown in FIGS. 2A and 2B, the semiconductor substrate may include the cell region CR provided with memory cells and the peripheral circuit region PR provided with peripheral circuits for controlling the memory cells. As an example, the semiconductor devices may include MOS transistors, diodes, and resistors. In exemplary embodiments, gate lines and bit lines may be formed on the cell region CR of the semiconductor substrate, and contact plugs connected to gate, source, and drain electrodes of the MOS transistor may be formed on the cell region CR.

The lower structure 100 may be configured in such a way that the uppermost layer thereof is at least one insulating layer having a flat top surface. The insulating layer may be formed of or include high-density plasma (HDP) oxide, tetraethyl orthosilicate (TEOS), plasma enhanced tetraethyl orthosilicate (PE-TEOS), $O_3$-tetraethyl orthosilicate ($O_3$-TEOS), undoped silicate glass (USG), phosphosilicate glass (PSG), borosilicate glass (BSG), borophosphosilicate glass (BPSG), fluoride silicate glass (FSG), spin on glass (SOG), Tonen SilaZene (TOSZ), or any combination thereof. Alternatively, the insulating layers may be formed of or include silicon nitride, silicon oxynitride, or low-k materials.

Before forming the interlayer insulating layer 121 on the lower structure 100, alignment keys 102 and first overlay keys 104 may be formed in the lower structure 100 provided on the peripheral circuit region PR. The formation of the alignment and first overlay keys 102 and 104 may include patterning the lower structure 100 provided on the peripheral circuit region PR.

Next, a first mold layer 108, a first supporting layer 110, a second mold layer 112, and a second supporting layer 114 may be sequentially formed on the lower structure 100. In certain exemplary embodiments, an etch stop layer 106 may be formed between the first mold layer 108 and the lower structure 100. In certain exemplary embodiments, the interlayer insulating layer 121 may include the etch stop layer 106, the first mold layer 108, the first supporting layer 110, the second mold layer 112, and the second supporting layer 114.

In exemplary embodiments, the first mold layer 108 and the second mold layer 112 may be formed of silicon oxide. The etch stop layer 106 may be formed of a material having an etch selectivity with respect to the uppermost flat insulating layer of the lower structure 100 and the first mold layer 108. For example, the etch stop layer 106 may be formed of at least one of a silicon nitride layer and/or a silicon oxynitride layer. The first supporting layer 110 and the second supporting layer 114 may be formed of a material having an etch selectivity with respect to the first mold layer 108 and the second mold layer 112. For exemplary, the first supporting layer 110 and the second supporting layer 114 may be formed of at least one of SiN, SiCN, TaO, or $TiO_2$. In exemplary embodiments, a thickness of the second supporting layer 114 may be substantially equal to or thicker than that of the first supporting layer 110. Each of the etch stop layer 106, the first mold layer 108, the first supporting layer 110, the second mold layer 112, and the second supporting layer 114 may be formed using a deposition process (e.g., chemical vapor deposition (CVD) or physical vapor deposition (PVD) process).

A first mask layer 116 may be formed on the interlayer insulating layer 121 (S20). The first mask layer 116 may be formed of a material having an etch selectivity with respect to the interlayer insulating layer 121. In exemplary embodiments, the first mask layer 116 may be formed of a metal layer. For example, the first mask layer 116 may include at least one of Al, Sc, Ti, Cr, Ni, Cu, Zn, Zr, Mo, Ru, Hf, Ta, W, Pt, La, or any alloys thereof. The first mask layer 116 may be formed using, for example, a sputtering process.

Trenches 118 may be formed in the first mask layer 116 on the peripheral circuit region PR (S30). For example, the first mask layer 116 of the peripheral circuit region PR may be patterned to form the trenches 118 exposing the interlayer insulating layer 121. The trenches 118 may be formed to expose portions of the interlayer insulating layer 121, which are positioned on the alignment keys 102 and the first overlay keys 104. In other words, the trenches 118 may be overlapped with the alignment keys 102 and the first overlay keys 104, when viewed in plan view.

For example, the formation of the trenches 118 may include patterning the first mask layer 116 of the peripheral circuit region PR to form first portions 118a of the trenches 118, and then, etching upper portions of the second supporting layer 114, which are exposed by the first portions 118a, to form second portions 118b of the trenches 118 (See FIG. 2B). In other words, each of the trenches 118 may include the first portions 118a and the second portions 118b that are vertically aligned to each other. As the result of the etching process, the trenches 118 may expose the second supporting layer 114 and have bottom surfaces that are lower than that of the first mask layer 116. In certain exemplary embodiments, each of the trenches 118 may be formed to have a downward tapered vertical section. For example, a width of each trench 118 may decrease from top to bottom.

Figure 3A:
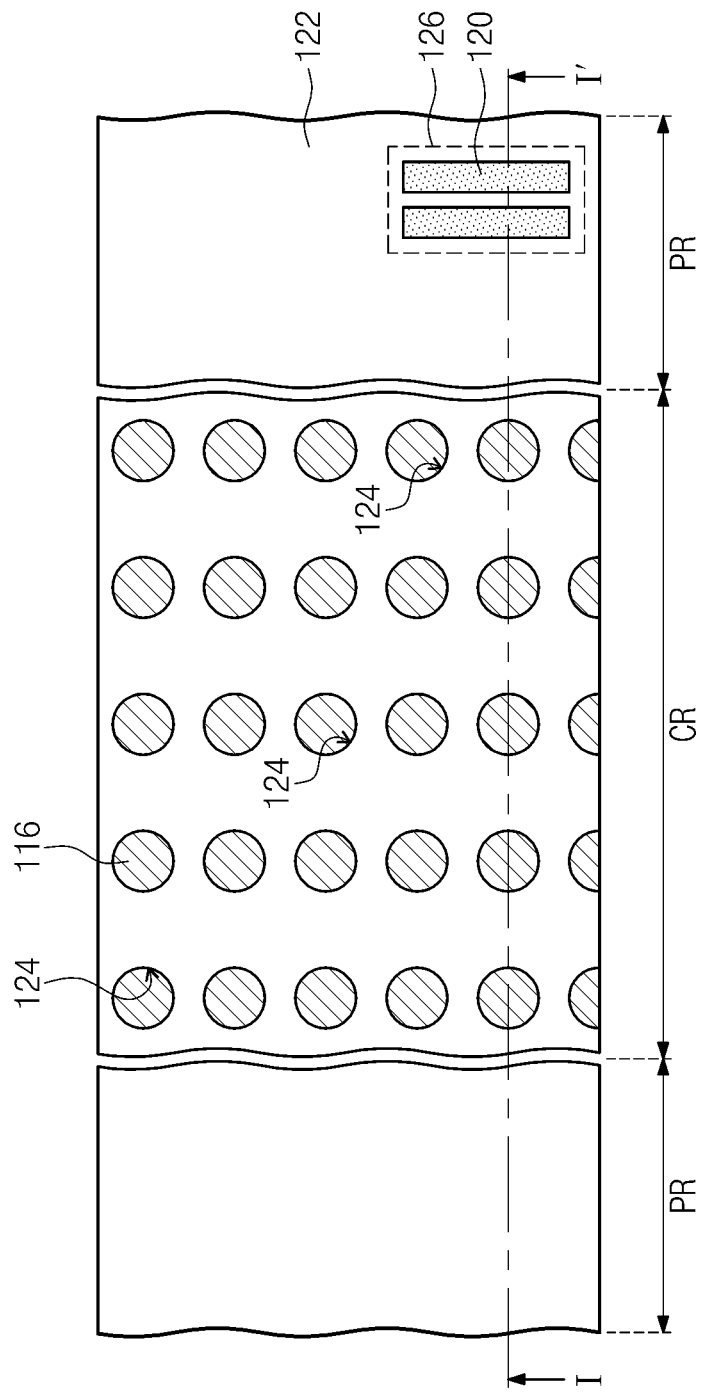
Figure 3B:
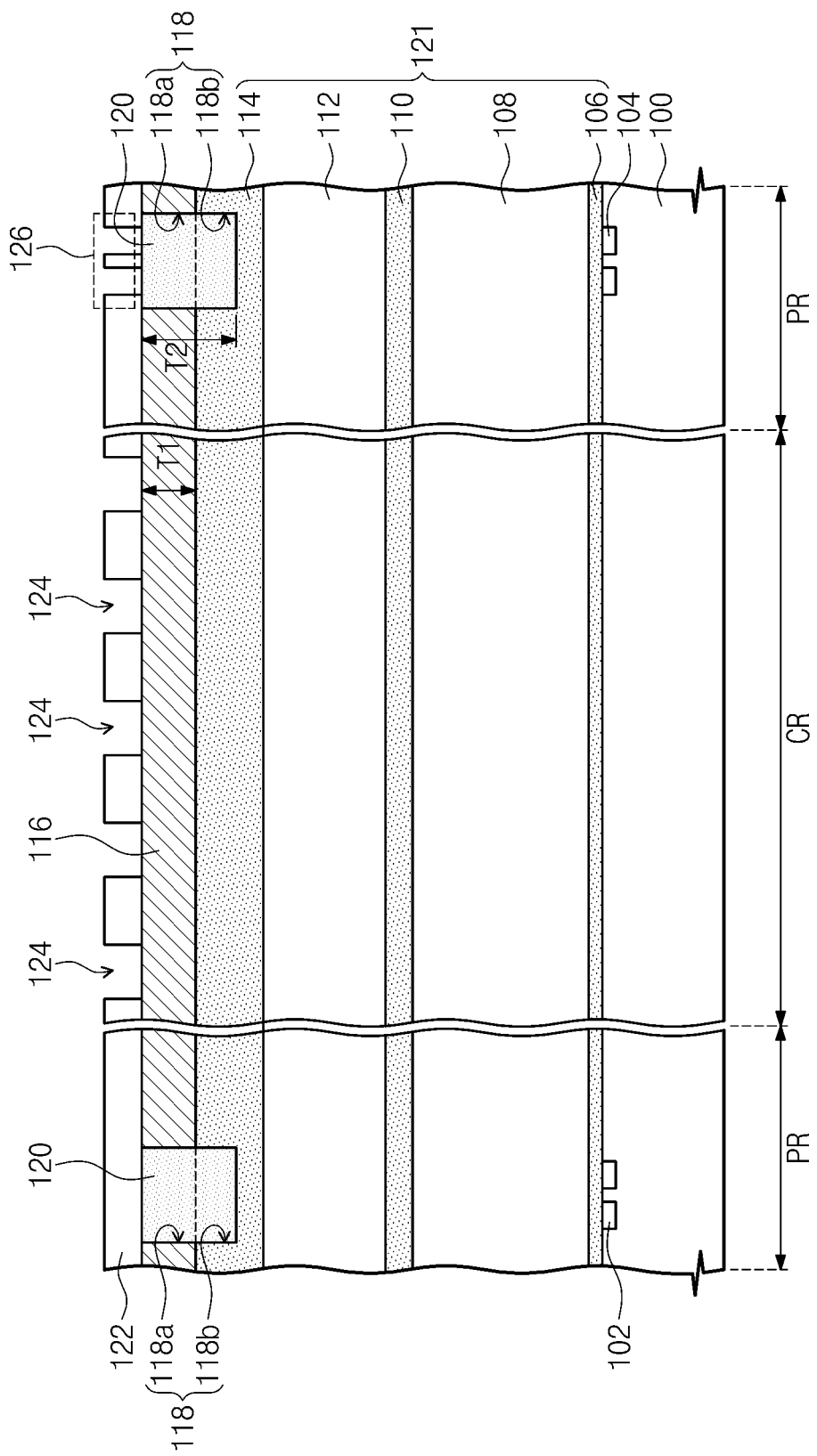

Referring to FIGS. 1, 3A, and 3B, key mask patterns 120 may be formed in the trenches 118 (S40). The formation of the key mask patterns 120 may include forming a second mask layer on the first mask layer 116 to fill the trenches 118, and then, planarizing the second mask layer to expose the first mask layer 116.

The key mask patterns 120 may be formed of a material having an etch selectivity with respect to the interlayer insulating layer 121 and may include at least one material differing from the first mask layer 116. The etch selectivity of the first mask layer 116 with respect to the interlayer insulating layer 121 may be higher than that of the key mask patterns 120 with respect to the interlayer insulating layer 121. In other words, under a specific etching condition, an etch rate of each of the first mask layer 116 and the key mask patterns 120 may be slower than an etch rate of the interlayer insulating layer 121, and the etch rate of the first mask layer 116 may be slower than the etch rate of the key mask patterns 120. In addition, the key mask patterns 120 may have an optical transmittance that is higher than that of the first mask layer 116. In certain exemplary embodiments, the key mask patterns 120 may be formed of a silicon layer. As an example, the key mask patterns 120 may be formed of at least one of a single crystalline silicon layer, a poly silicon layer, and a doped silicon layer doped with impurities (e.g., boron (B), carbon (C), nitrogen (N), and so forth).

The first mask layer 116 may have a first thickness T1 that is defined as a distance between top and bottom surfaces thereof, and the key mask patterns 120 may have a second thickness T2 that is defined as a distance between top and bottom surfaces thereof (See FIG. 3B). In certain exemplary embodiments, the top surfaces of the key mask patterns 120 may be coplanar with that of the first mask layer 116, and the bottom surfaces of the key mask patterns 120 may be positioned below that of the first mask layer 116. In other words, the second thickness T2 of the key mask patterns 120 may be larger than the first thickness T1 of the first mask layer 116.

Preliminary mask patterns 122 may be formed on the first mask layer 116 and the key mask patterns 120. The preliminary mask patterns 122 may include preliminary openings 124 on the cell region CR and second overlay keys 126 on the peripheral circuit region PR. Here, each of the preliminary openings 124 may be formed to expose the top surface of the first mask layer 116 and thereby to define positions of holes that will be formed on the cell region CR, and each of the second overlay keys 126 may be formed to expose portions of the top surface of the key mask patterns 120 and be overlapped with the first overlay keys 104, when viewed in plan view (See FIG. 3B).

In detail, the formation of the preliminary mask patterns 122 may include forming a preliminary mask layer on the first mask layer 116 and the key mask patterns 120, performing an exposing and developing process to form photoresist patterns on the preliminary mask layer, and etching the preliminary mask layer using the photoresist patterns as an etch mask.

The preliminary mask layer may be formed of a material having an etch selectivity with respect to the first mask layer 116 and the key mask patterns 120. As an example, the preliminary mask layer may include a silicon oxide layer.

During the exposing and developing process, the photoresist patterns may be aligned and overlaid relative to the lower structure 100 using the key mask patterns 120. In other words, in the exposing and developing process, the alignment keys 102 on the lower structure 100 may be detected or perceived through the key mask patterns 120, and thus it is possible to align precisely the photoresist patterns to the lower structure 100. Further, by virtue of the presence of the key mask patterns 120, the first overlay keys 104 of the lower structure 100 can be detected or perceived, and thus it is possible to overlap the second overlay keys 126 to the first overlay keys 104, when viewed in plan view.

In certain exemplary embodiments, the key mask patterns 120 may be formed in such a way that each of the key mask patterns 120 is overlapped to a corresponding one of the alignment keys 102 and the first overlay keys 104, when viewed in plan view (See, e.g., FIG. 3B). As described above, the key mask patterns 120 may have optical transmittance higher than that of the first mask layer 116, and accordingly, it is easy to align and overlay the preliminary mask patterns 122 relative to the patterns of the lower structure 100.

Figure 4A:
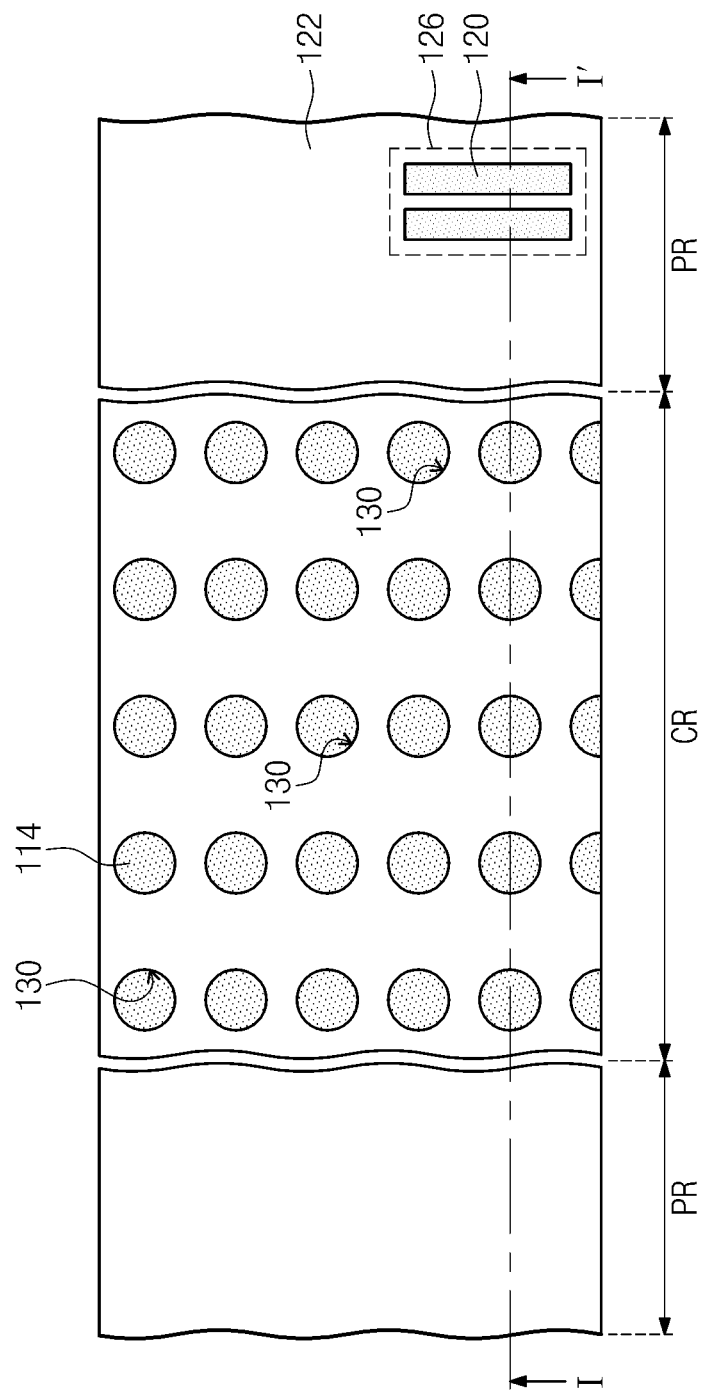
Figure 4B:
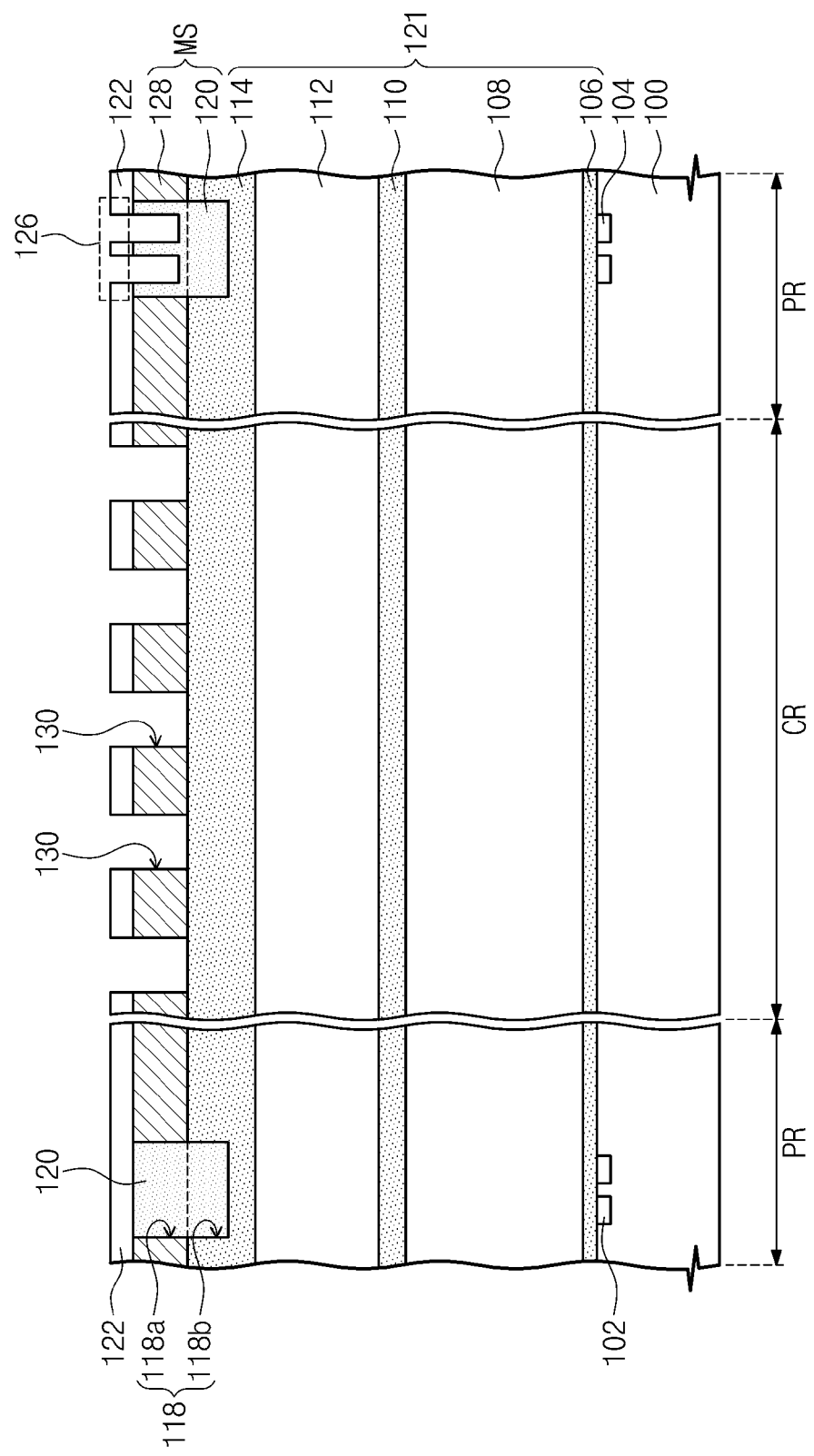

Referring to FIGS. 1, 4A, and 4B, the first mask layer 116 on the CR region may be patterned to form first mask patterns 128 (S50). The first mask layer 116 may be etched using the preliminary mask patterns 122 as an etch mask to form the first mask patterns 128. The first mask patterns 128 may be formed to have openings 130 on the cell region CR. The openings 130 may define positions and shapes of the holes. The openings 130 may be formed to expose the top surface of the second supporting layer 114 in the CR region. In the etching process, the key mask patterns 120 exposed by the second overlay keys 126 of the peripheral circuit region PR may also be partially recessed. Hereinafter, the first mask patterns 128 and the key mask patterns 120 will be referred to as a "mask structure MS". In certain exemplary embodiments, the preliminary mask patterns 122 may partially remain on the mask structure MS, after the etching process.

Figure 5A:
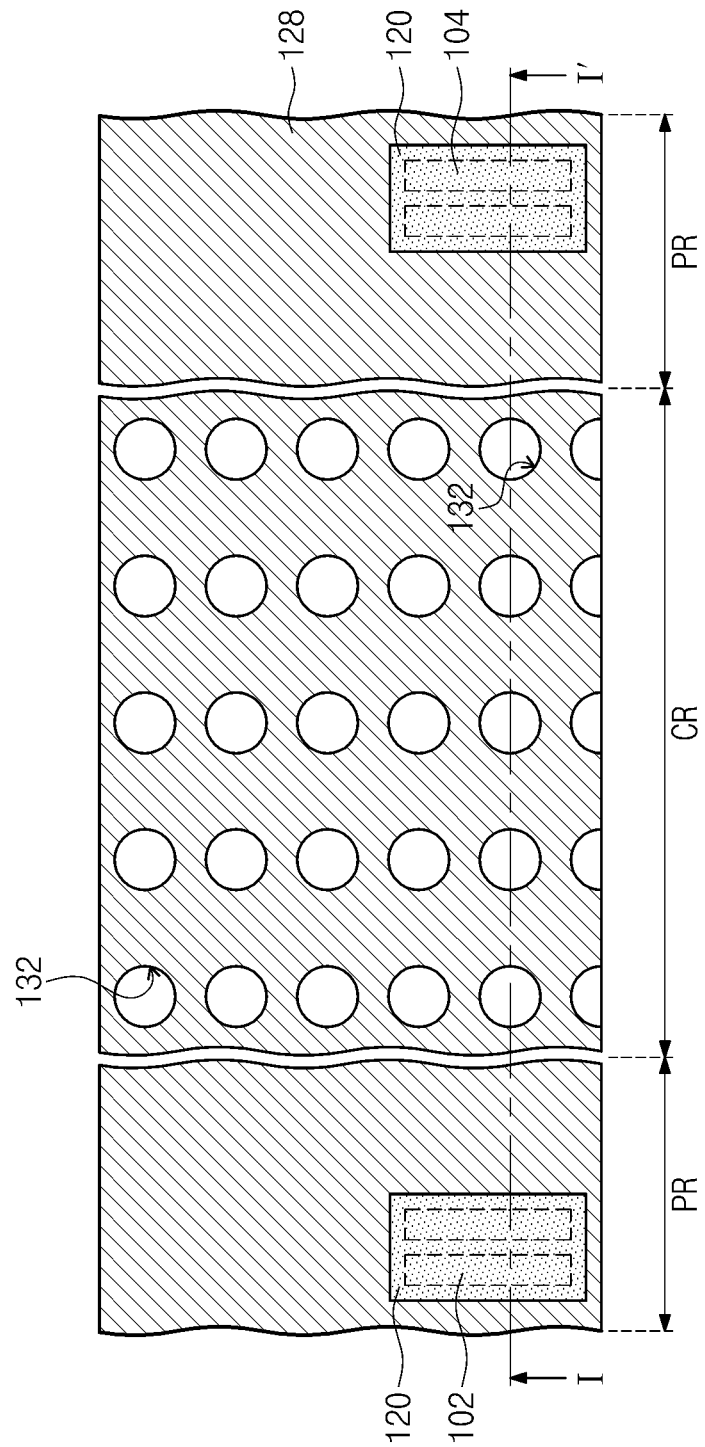
Figure 5B:
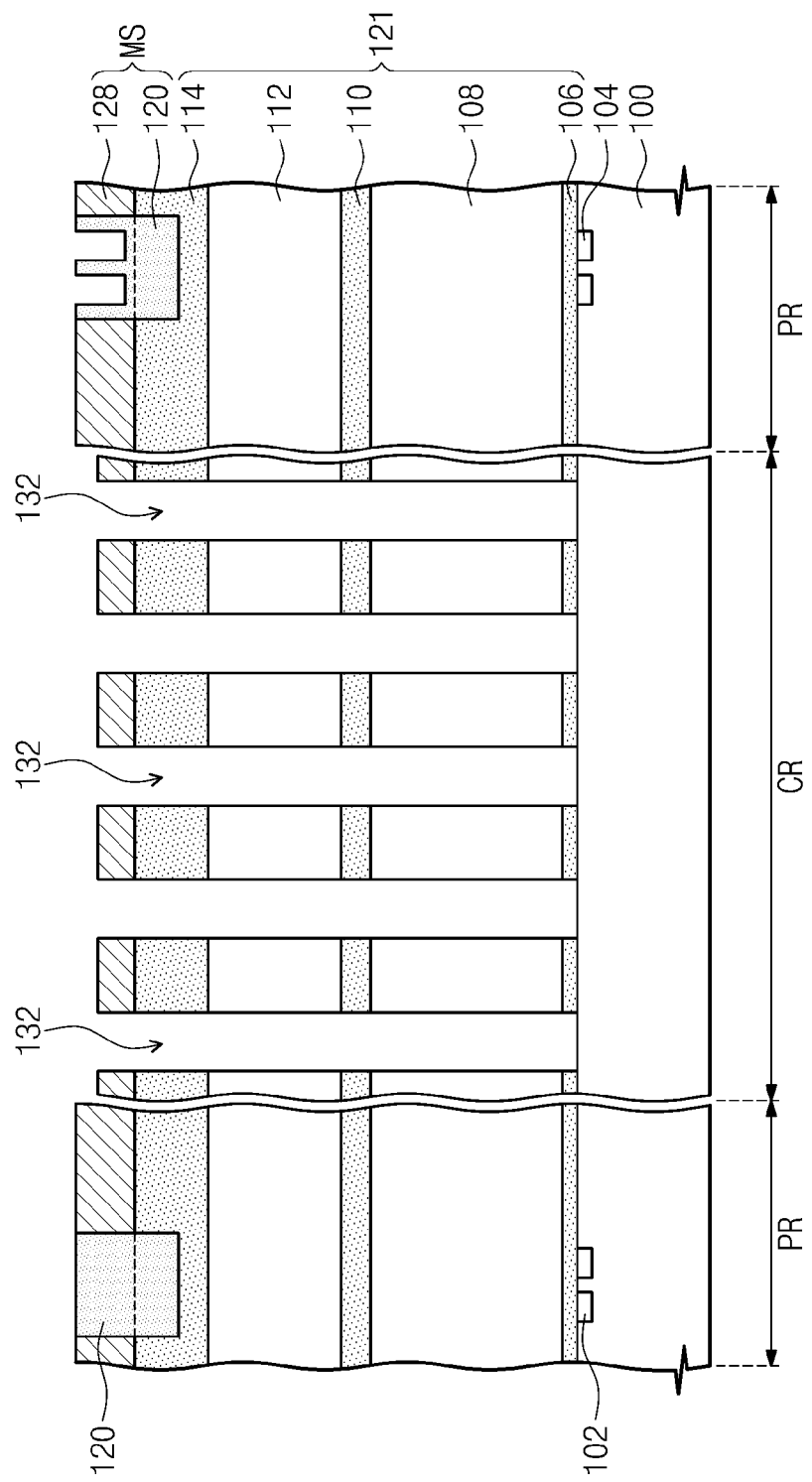

Referring to FIGS. 1, 5A, and 5B, holes 132 may be formed in the interlayer insulating layer 121 using the first mask patterns 128 (S60). The holes 132 may expose the lower structure 100 through the interlayer insulating layer 121. When viewed in plan view, the holes 132 may be two-dimensionally disposed on the lower structure 100 of the cell region CR. As shown in FIG. 5A, when viewed in plan view, the holes may be arranged in row and column directions. Alternatively, the holes 132 may be arranged to have a zigzag arrangement, when viewed in plan view.

The formation of the holes 132 may include etching the interlayer insulating layer 121 using the mask structure MS as an etch mask. For example, the second supporting layer 114, the second mold layer 112, the first supporting layer 110, and the first mold layer 108 may be sequentially and anisotropically etched using the mask structure MS as the etch mask. Further, the etching process may be performed in an over-etch manner to remove the etch stop layer 106 and thereby to expose the top surface of the lower structure 100. Because the etching process is performed using an anisotropic etching technology, a width of each hole 132 may be smaller at a bottom thereof than at a top thereof.

In the case where the holes 132 have a high aspect ratio, the remaining portion of the preliminary mask patterns 122 may be removed and a top portion of the mask structure MS may be partially etched, during the etching process.

At an initial stage of the etching process, top portions of the first mask patterns 128 of the cell region CR and the peripheral circuit region PR may be etched. Owing to the loading effect, an etch amount of the first mask patterns 128 may be less on the peripheral circuit region PR than on the cell region CR.

Further, top portions of the key mask patterns 120 of the peripheral circuit region PR may also be etched during the etching process. Although the etch selectivity of the key mask patterns 120 with respect to the interlayer insulating layer 121 is smaller than that of the first mask patterns 128 with respect to the interlayer insulating layer 121 (i.e., although the etch rate of the key mask patterns 120 may be faster than the etch rate of the first mask patterns 128 under an etching condition of the etching process), an etch amount of the key mask patterns 120 of the peripheral circuit region PR may be smaller than that of the first mask patterns 128 of the cell region CR, by virtue of the loading effect. In addition, as described with reference to FIG. 3B, the key mask patterns 120 may be thicker than the first mask patterns 128, and thus, after the etching process, the key mask patterns 120 may remain on the interlayer insulating layer 121 and protect the interlayer insulating layer 121 against the etching process.

According to exemplary embodiments of the inventive concept, the first mask patterns 128 having high etch selectivity with respect to the interlayer insulating layer 121 may be used to form the holes 132 having a high aspect ratio on the cell region CR, and thus, it is possible to increase a process margin in the process of etching the holes 132. Further, on the peripheral circuit region PR, the key mask patterns 120 may be formed to have a thickness larger than that of the first mask patterns 128, and thus it is possible to protect the interlayer insulating layer 121 covered with the key mask patterns 120 from the etching process of the holes 132.

Referring to FIGS. 6A and 6B, sacrificial patterns 134 may be formed in the holes 132. The formation of the sacrificial patterns 134 may include forming a sacrificial layer on the resulting structure of FIGS. 5A and 5B to fill the holes 132, and then, planarizing the sacrificial layer to expose the mask structure MS. In certain exemplary embodiments, the sacrificial layer may include a carbon-containing oxide layer (such as, e.g., spin-on hardmask (SOH)). In certain exemplary embodiments, the planarization of the sacrificial layer may be performed using an etch-back process. In certain exemplary embodiments, the sacrificial patterns 134 may be over-etched to localize the sacrificial patterns 134 in the holes 132.

Figure 7A:
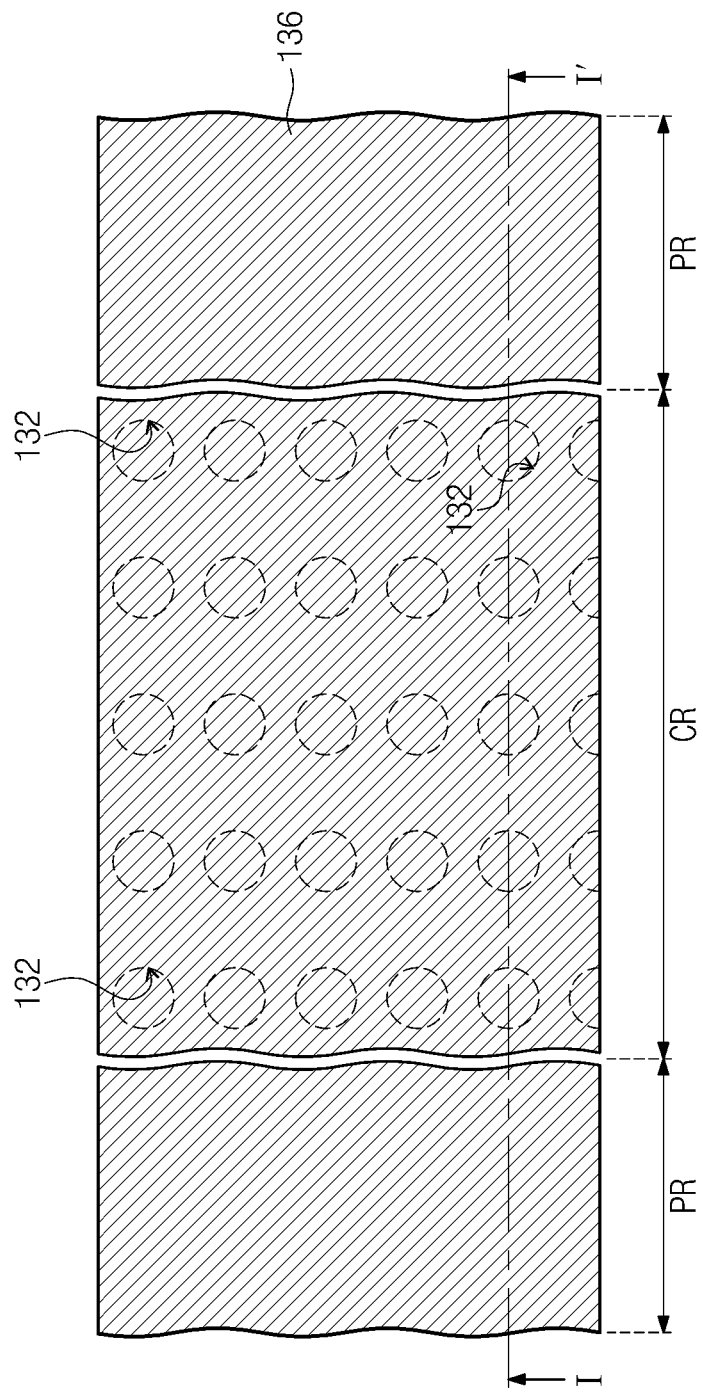
Figure 7B:
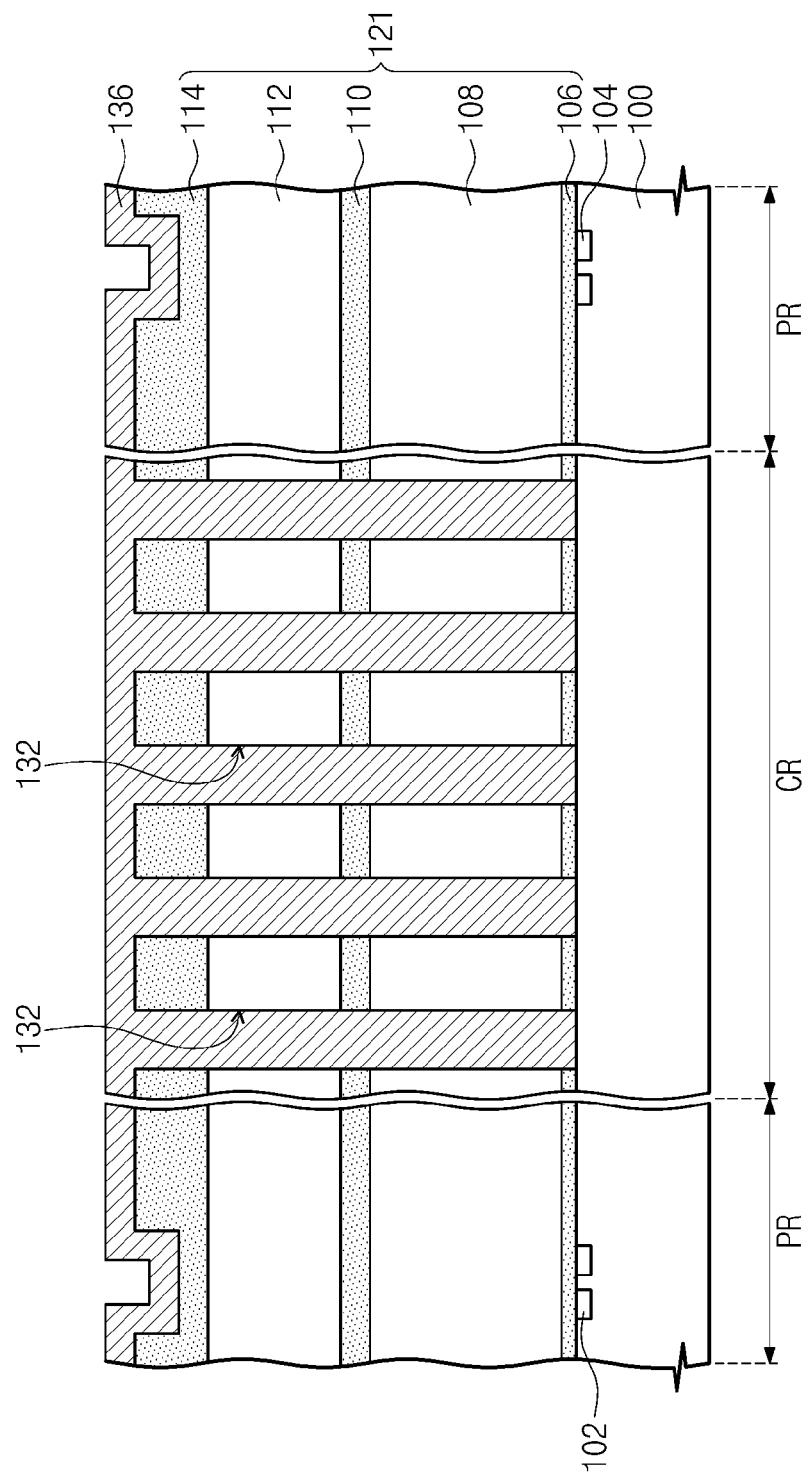

Referring to FIGS. 7A and 7B, the mask structure MS may be removed and a conductive layer 136 formed. As an example, the mask structure MS may be removed using a dry etching process. The etching process may be performed using an etching condition capable of providing high etch selectivity with respect to the interlayer insulating layer 121. In the etching process, the holes 132 may be protected by the sacrificial patterns 134. Thereafter, the sacrificial patterns 134 may be removed by an ashing and strip process.

After the sacrificial patterns 134 are removed, the conductive layer 136 may be formed to fill the holes 132. The conductive layer 136 may include at least one of metal materials, metal nitrides, or metal silicides. As an example, the conductive layer 136 may be formed of at least one of refractory metals, such as cobalt, titanium, nickel, tungsten, or molybdenum. As another example, the conductive layer 136 may be formed of at least one of metal nitrides, such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN). As another example, the conductive layer 136 may be formed of at least one noble metal selected from the group consisting of platinum (Pt), ruthenium (Ru), and iridium (Ir). Further, the conductive layer 136 may be formed of conductive noble metal oxide (such as, e.g., PtO, $RuO_2$, or $IrO_2$) or conductive oxide materials (such as, e.g., $SRO(SrRuO_3)$, BSRO $((Ba,Sr)RuO_3)$, $CRO(CaRuO_3)$, or LSCo).

The conductive layer 136 may be formed using a technique capable of forming a layer with high step coverage (for example, chemical vapor deposition (CVD), physical vapor deposition (PVD), or atomic layer deposition (ALD)). In certain exemplary embodiments, as shown in FIG. 7B, the conductive layer 136 may be formed to fill wholly the holes 132. In other exemplary embodiments, the conductive layer 136 may be formed to cover conformally inner surfaces of the holes 132.

Figure 8B:
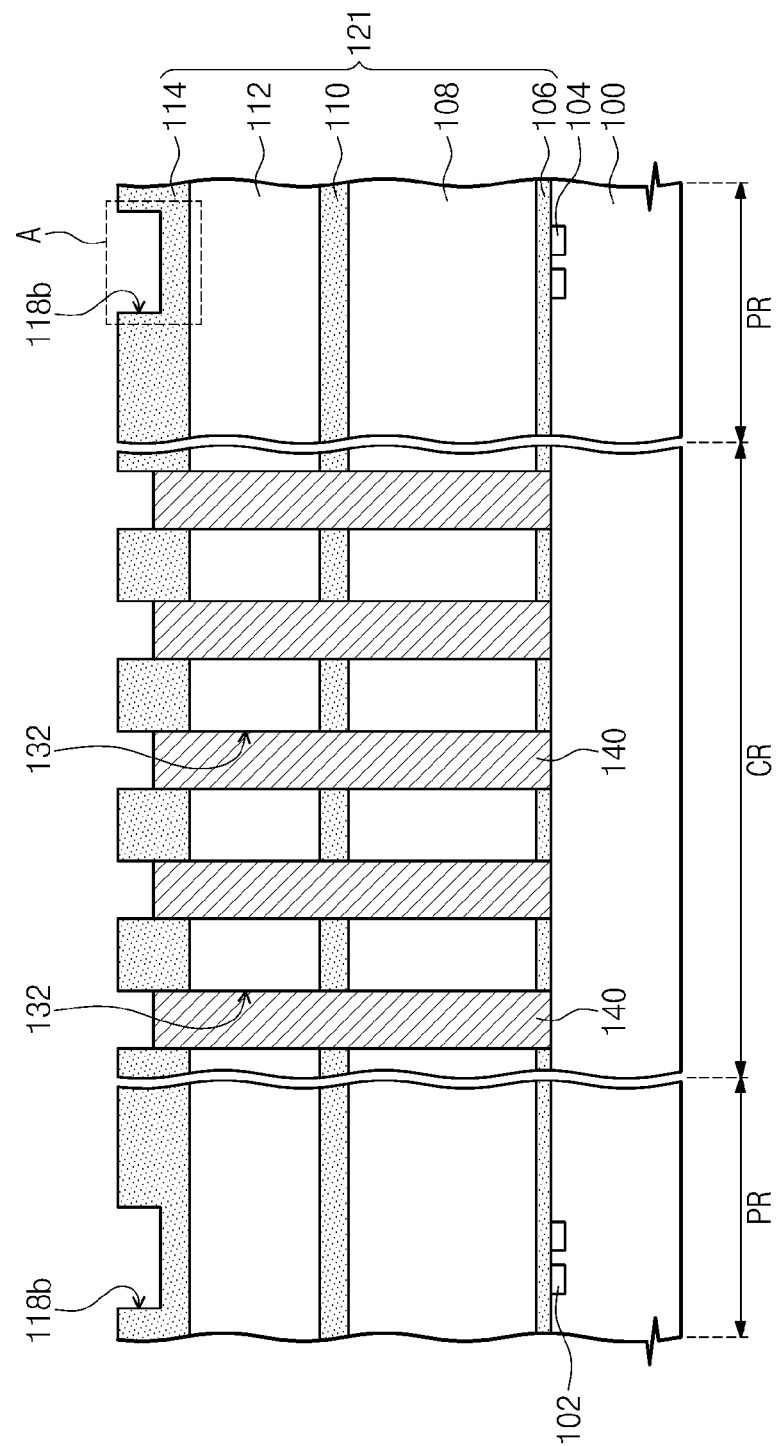

Referring to FIGS. 8A and 8B, lower electrodes 140 may be formed in the holes 132. The formation of the lower electrodes 140 may include planarizing the conductive layer 136 to expose the second supporting layer 114. As an example, the planarization may be performed using an etch-back process. As the result of the planarization, the lower electrodes 140 may be locally formed in the holes 132, respectively, and be separated from each other. In certain exemplary embodiments, top surfaces of the lower electrodes 140 may be partially recessed in the planarization process and be positioned below the top surface of the interlayer insulating layer 121 adjacent thereto.

In certain exemplary embodiments, as shown in FIG. 8B, each of the lower electrodes 140 may be formed to have a pillar shape. In other exemplary embodiments, the lower electrodes 140 may be formed to have a hollow cylindrical shape.

Figure 8C:
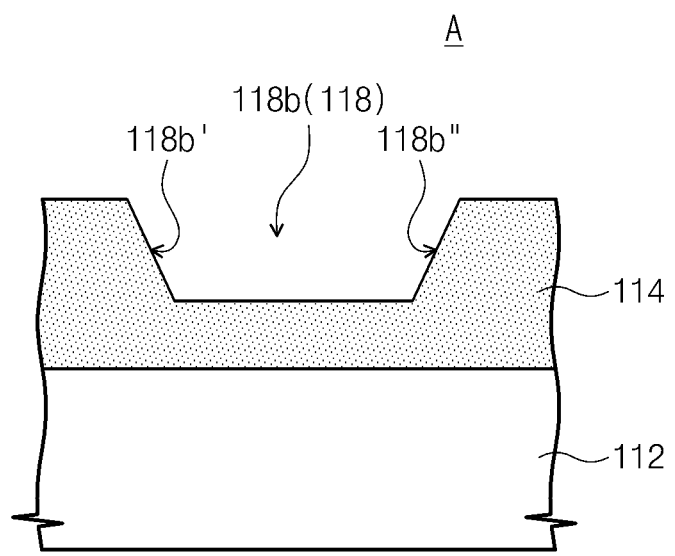
FIG. 8C is an enlarged sectional view of a portion A of FIG. 8B.

FIG. 8C is an enlarged sectional view of a portion A of FIG. 8B. Referring to FIG. 8C, the second portions 118b of the trenches 118 may be formed to have slant sidewalls, as described with reference to FIG. 2B. For example, for each of the trenches 118, a lower width of the trench 118 may be smaller than an upper width of the trench 118. That is, a lower width from wall 118b' to wall 118b" may be smaller than an upper width of the trench 118 from wall 118b' to wall 118b". Accordingly, in the case where the conductive layer 136 is over-etched during the planarization process, the conductive layer 136 may be wholly removed from the sidewalls of the second portions 118b.

Figure 9A:
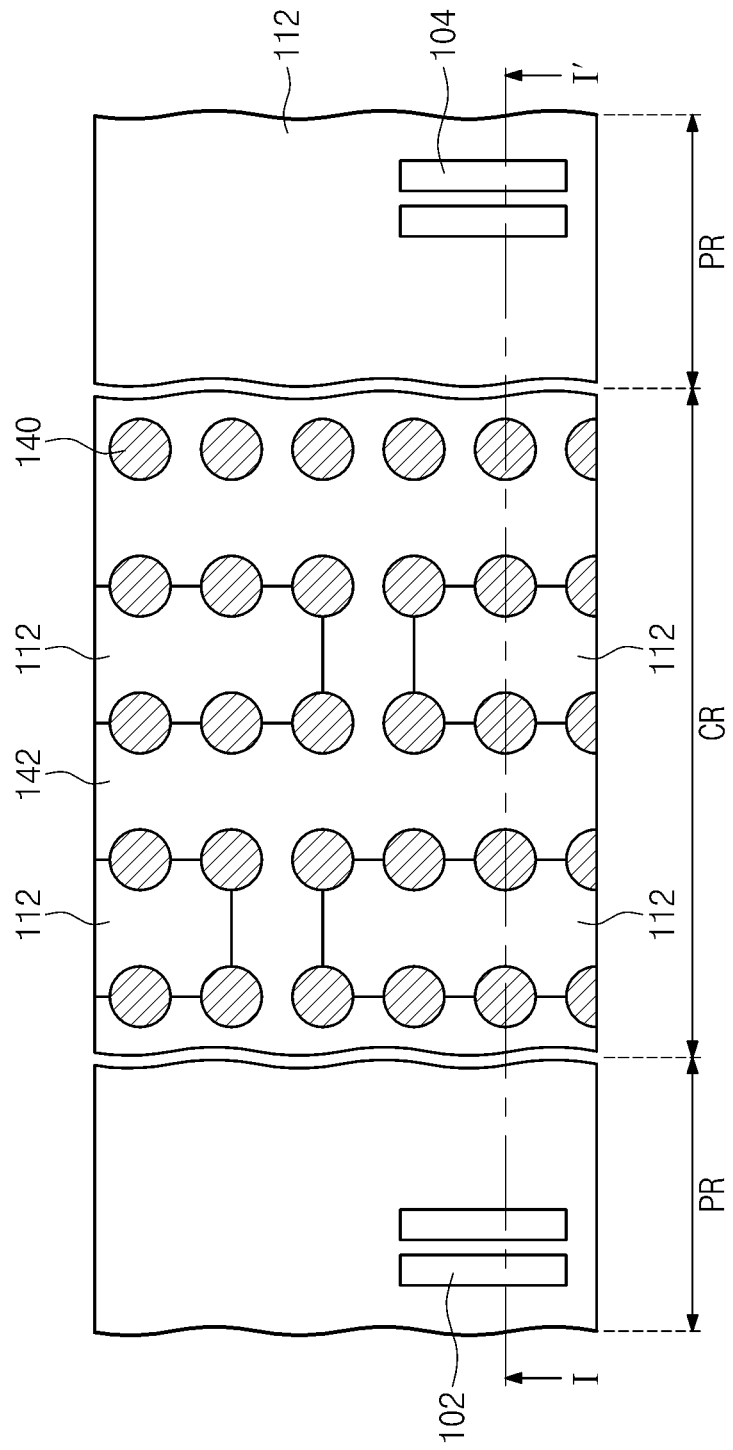
Figure 9B:
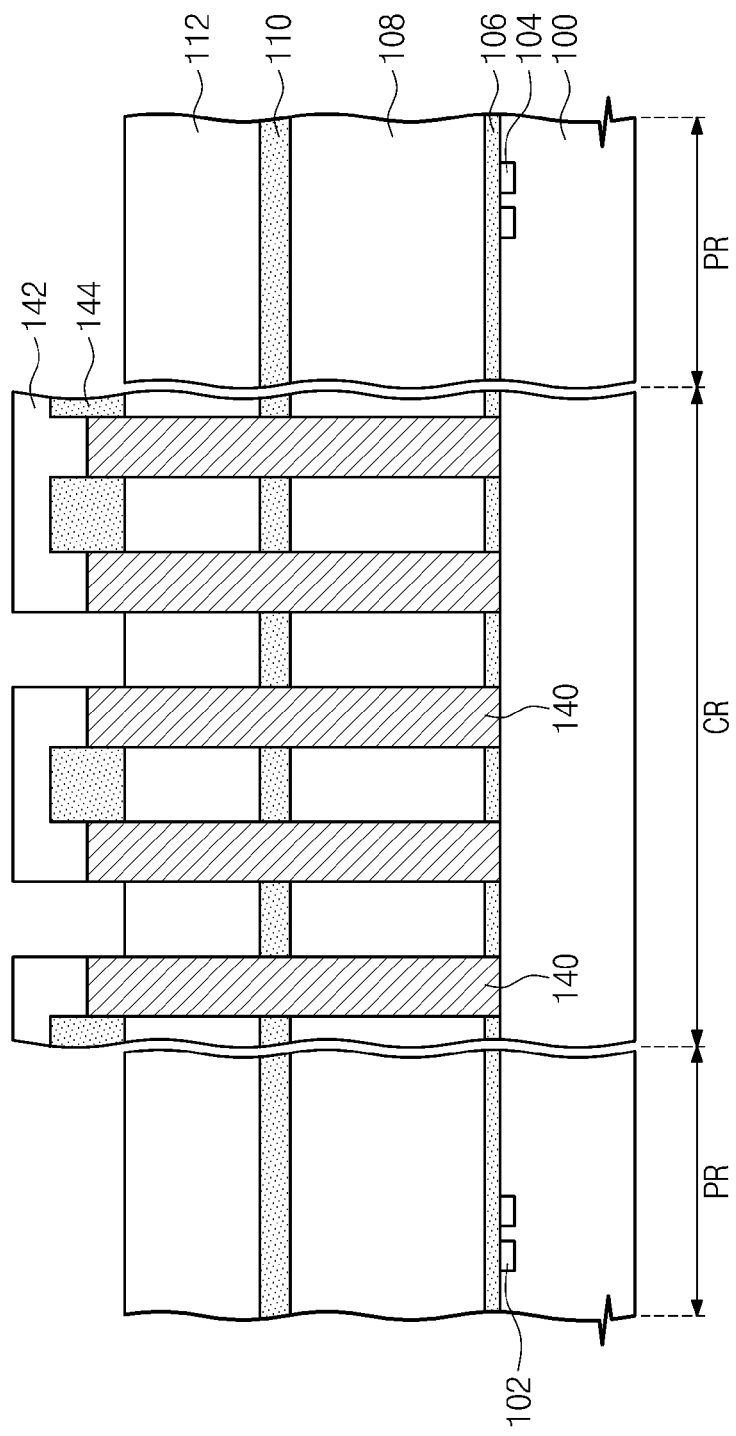

Referring to FIGS. 9A and 9B, supporting mask patterns 142 may be formed on the structure of FIG. 8B to define shapes and disposition of supporting patterns that will be formed in a subsequent process. The supporting mask patterns 142 may be formed of a silicon oxide layer, or may include a silicon oxide layer. In exemplary embodiments, each of the supporting mask patterns 142 may be formed to cover at least two adjacent ones of the lower electrodes 140. The second supporting layer 114 may be etched using the supporting mask patterns 142 as an etch mask to form second supporting patterns 144. FIG. 9B shows the structure after the second supporting layer 114 is etched to form the second supporting patterns 144. The second supporting patterns 144 may be formed to expose a top surface of the second mold layer 112.

Figure 10A:
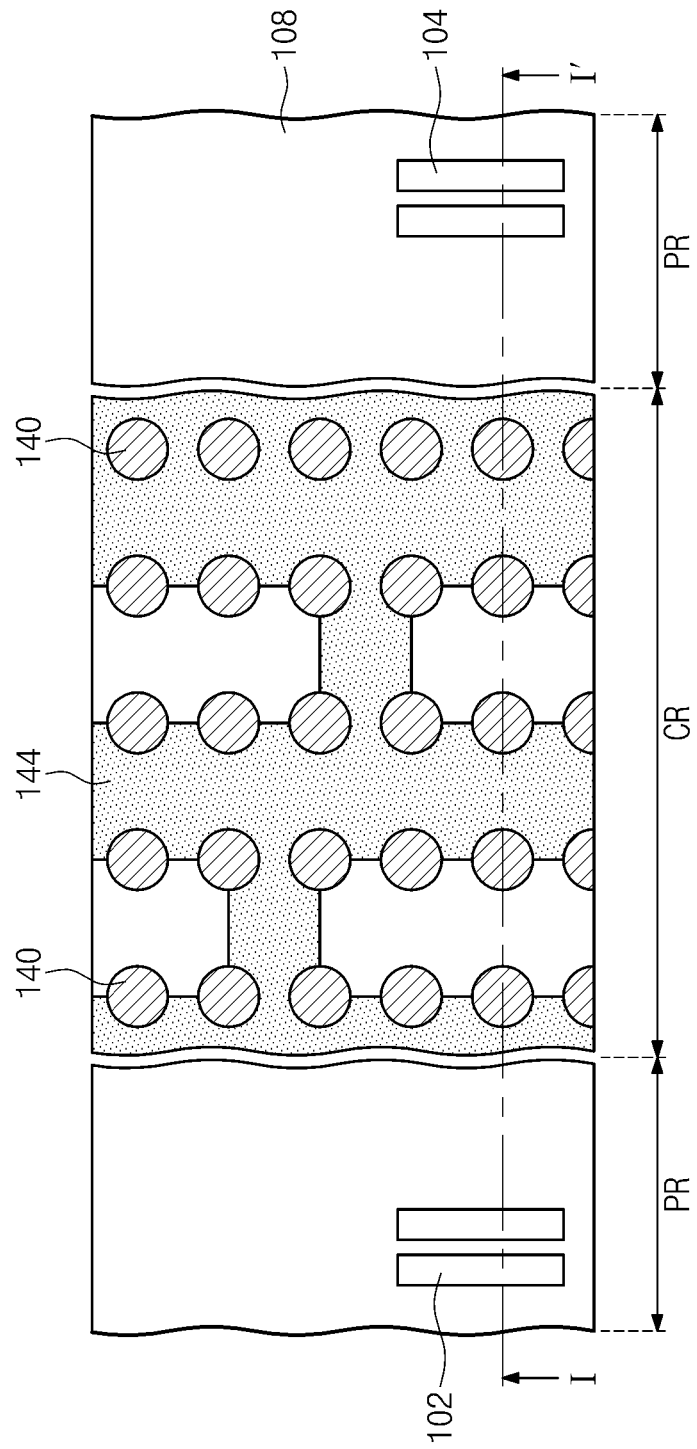
Figure 10B:
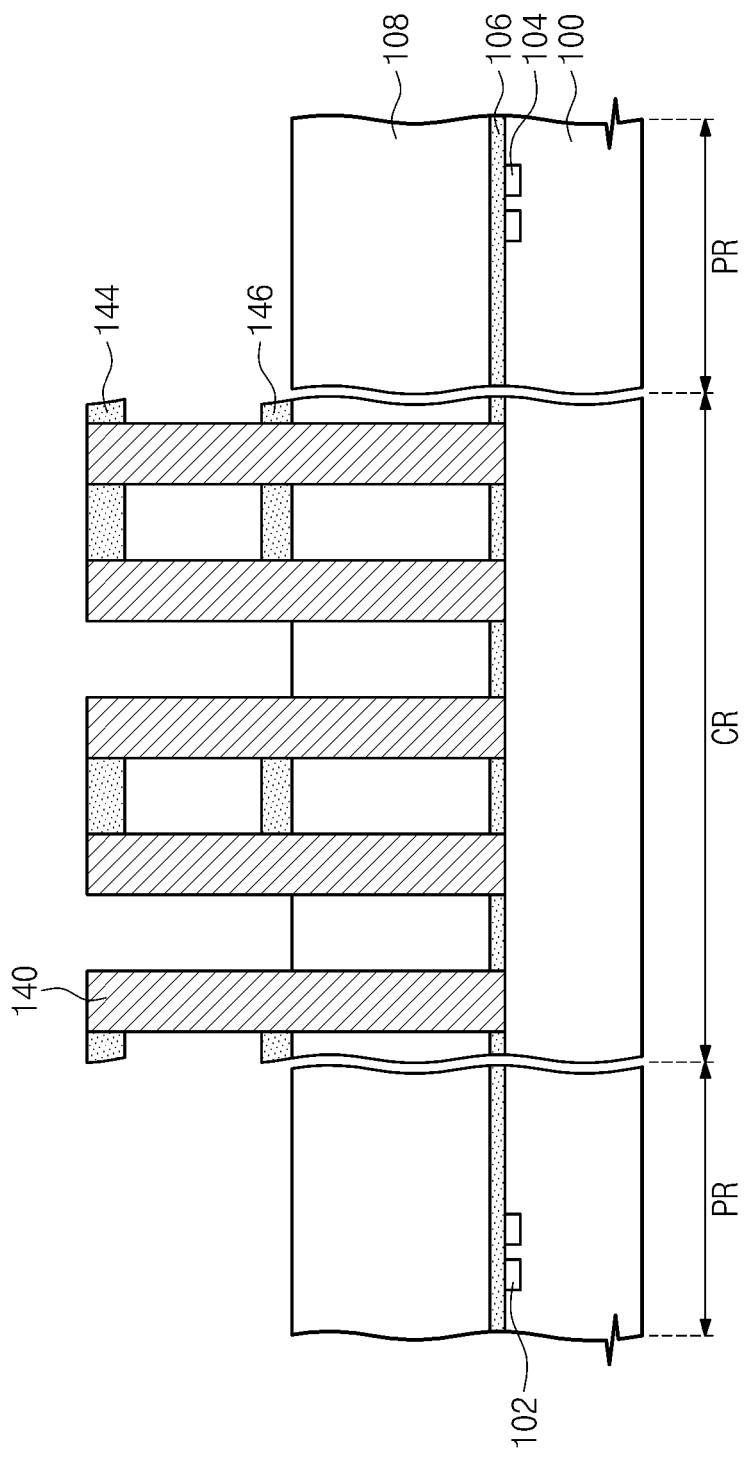

Referring to FIGS. 10A and 10B, an isotropic etching process may be performed to remove the supporting mask patterns 142 and the second mold layer 112. As a result, a top surface of the first supporting layer 110 and upper sidewalls of the lower electrodes 140 may be exposed. Next, an etch-back process may be performed to the second supporting pattern 144. For example, an upper portion of the second supporting pattern 144 may be etched, and the first supporting layer 110 exposed by the second supporting pattern 144 may be etched to form first supporting patterns 146, during the etch-back process. FIG. 10B shows the structure after the first supporting layer 110 is etched to form the first supporting patterns 146. The first supporting patterns 146 may be overlapped with the second supporting pattern 144, when viewed in plan view. In the case where the second supporting layer 114 has a thickness larger than that of the first supporting layer 110, it is possible to prevent the second supporting patterns 144 from being removed when the first supporting patterns 146 are formed. Further, the etch-back process may be performed to expose the top surface of the first mold layer 108.

Figure 11A:
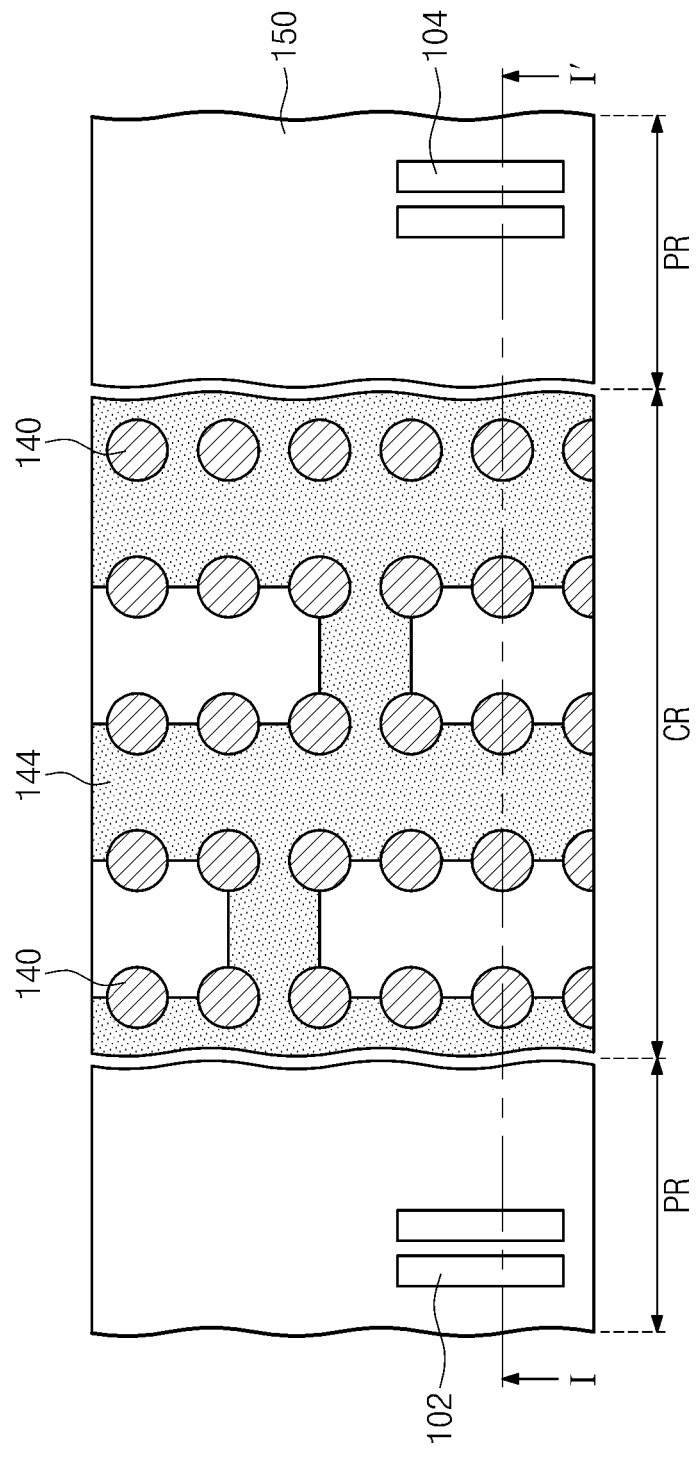
Figure 11B:
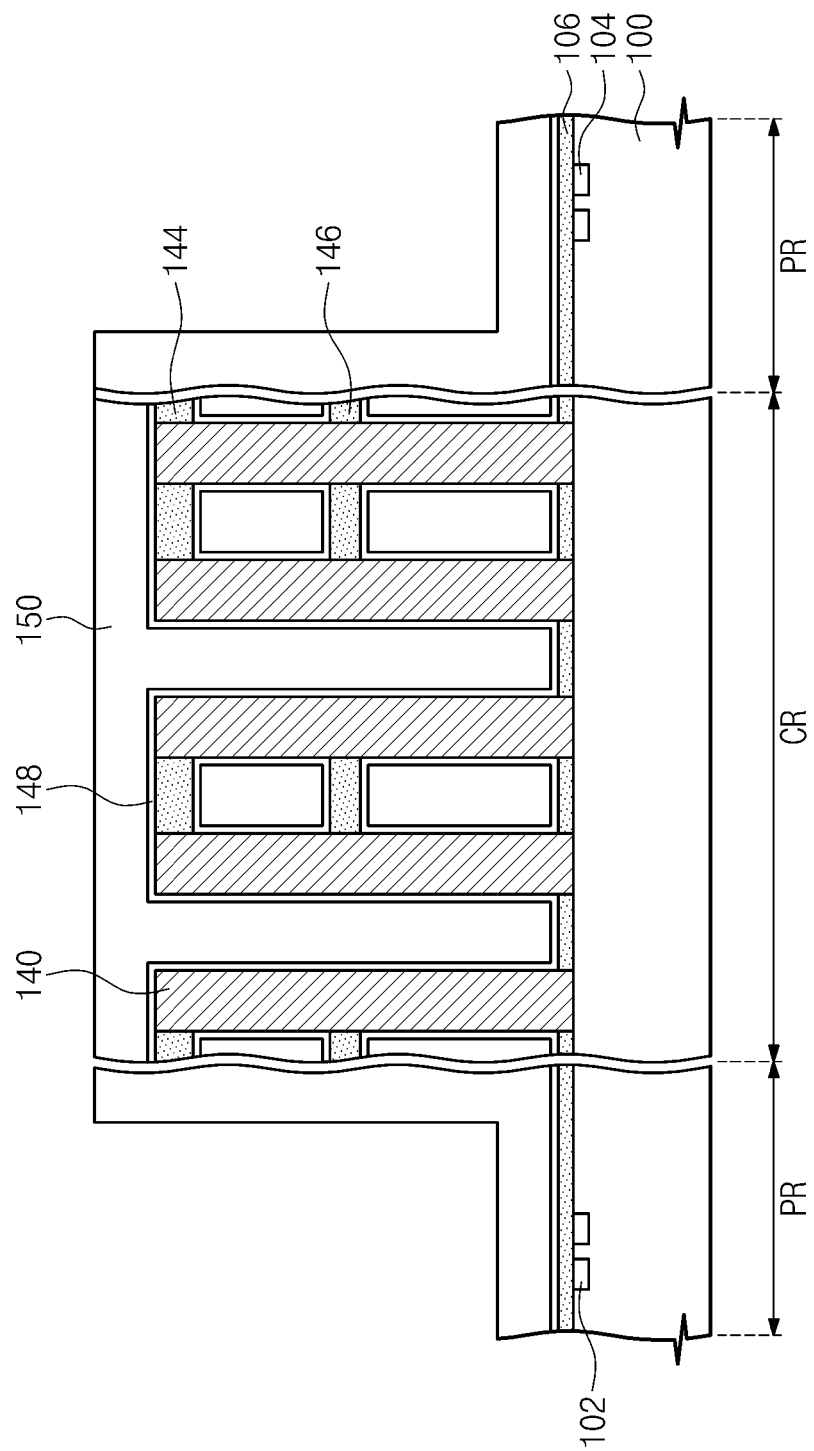

Referring to FIGS. 11A and 11B, an isotropic etching process may be performed to remove the first mold layer 108. For example, the removal of the first mold layer 108 may be performed to expose lower sidewalls of the lower electrodes 140 and a top surface of the etch stop layer 106. Thereafter, a dielectric layer 148 may be formed, and an upper electrode 150 may be formed on the dielectric layer 148.

As an example, the dielectric layer 148 may be formed of at least one of metal oxides (such as $HfO_2$, $ZrO_2$, $Al_2O_3$, $La_2O_3$, $Ta_2O_3$, and $TiO_2$) or perovskite dielectrics (such as $SrTiO_3$ STO, $(Ba,Sr)TiO_3$ BST, $BaTiO_3$, lead zirconate titanate, and PLZT). The upper electrode 150 may be formed of or include at least one of doped silicon, metal materials, metal nitrides, or metal silicides. For example, the upper electrode 150 may be formed of a refractory metal layer (e.g., of cobalt, titanium, nickel, tungsten, or molybdenum). In other exemplary embodiments, the upper electrode 150 may be formed of at least one of metal nitrides, such as titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), or tungsten nitride (WN). In still other exemplary embodiments, the upper electrode 150 may be formed of at least one noble metal selected from the group consisting of platinum (Pt), ruthenium (Ru) and iridium (Ir). In yet other exemplary embodiments, the upper electrode 150 may be formed of conductive noble metal oxide (such as PtO, $RuO_2$, or $IrO_2$) or conductive oxide materials (such as $SRO(SrRuO_3)$, BSRO $((Ba,Sr)RuO_3)$, CRO $(CaRuO_3)$, or LSCo).

As an example, the dielectric layer 148 and the upper electrode 150 may be formed using a technique capable of forming a layer with high step coverage (for example, chemical vapor deposition (CVD), physical vapor deposition (PVD), or atomic layer deposition (ALD)).

According to exemplary embodiments of the inventive concept, the holes 132 with high aspect ratio may be formed in the interlayer insulating layer 121 of the cell region CR. The first mask patterns 128 having high etch selectivity with respect to the interlayer insulating layer 121 may be used in the process of forming the holes 132, and the use of the first mask patterns 128 makes it possible to increase a process margin in the process of etching the holes 132. In addition, on the peripheral circuit region PR, the key mask patterns 120 may be formed to be overlapped with the alignment keys 102 and the first overlay keys 104, when viewed in plan view. The key mask patterns 120 may be formed to have optical transmittance higher than that of the first mask patterns 128, and this makes it easy to control alignment and overlay between upper and lower layers. In other words, in the process of forming the holes 132 with high aspect ratio, the use of the first mask patterns 128 with high selectivity makes it possible to increase the process margin, and the use of the key mask patterns 120 with high optical transmittance makes it easy to control the alignment and overlay between the upper and lower layers.

Further, on the peripheral circuit region PR, the key mask patterns 120 may be formed to have a thickness larger than that of the first mask patterns 128, and this makes it possible to protect the interlayer insulating layer 121 covered with the key mask patterns 120 from the etching process of the holes 132.

Figure 12:
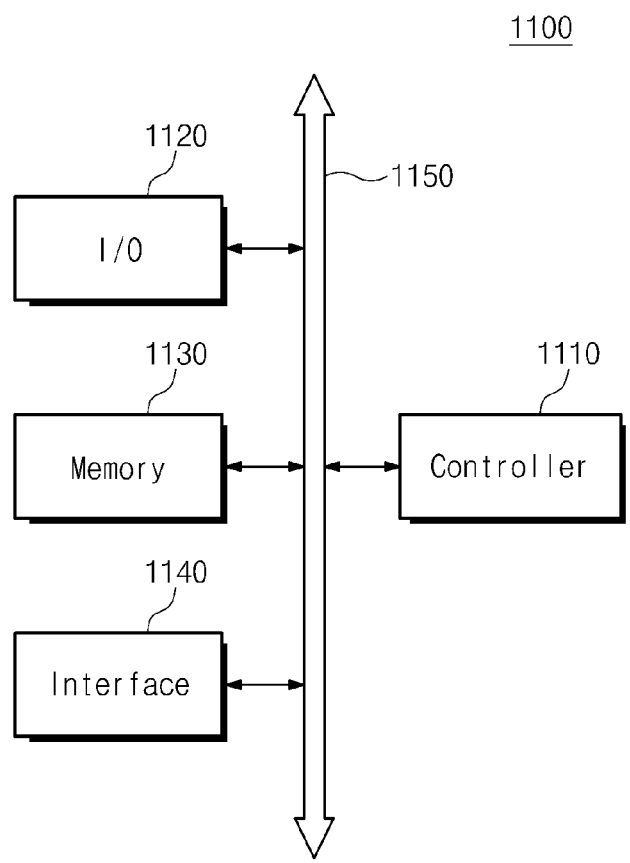
FIG. 12 is a schematic block diagram illustrating an example of an electronic system including a semiconductor device according to an exemplary embodiment.

FIG. 12 is a schematic block diagram illustrating an example of electronic systems including a semiconductor device according to exemplary embodiments of the inventive concept.

Referring to FIG. 12, an electronic system 1100 may include a controller 1110, an input/output (I/O) 1120, a memory 1130, an interface 1140 and a data bus 1150. At least two of the controller 1110, the I/O 1120, the memory 1130 and the interface 1140 may communicate with each other through the data bus 1150. The data bus 1150 may correspond to a path through which electrical signals are transmitted.

The controller 1110 may include at least one of a microprocessor, a digital signal processor, a microcontroller or another logic device. The another logic device may have a similar function to any one of the microprocessor, the digital signal processor and the microcontroller. The I/O 1120 may include a keypad, a keyboard and/or a display. The memory 1130 may store data and/or commands. The memory 1130 may include one of semiconductor devices according to exemplary embodiments of the inventive concept. In other exemplary embodiments, the memory 1130 may further include a semiconductor memory device, which is of a different type from the semiconductor memory devices according to the afore-described exemplary embodiments of the inventive concept. The interface 1140 may transmit electrical data to a communication network or may receive electrical data from a communication network.

The electronic system 1100 may be applied to a laptop computer, a personal digital assistant (PDA), a portable computer, a web tablet, a wireless phone, a mobile phone, a digital music player, a memory card or an electronic product, or the like.

Figure 13:
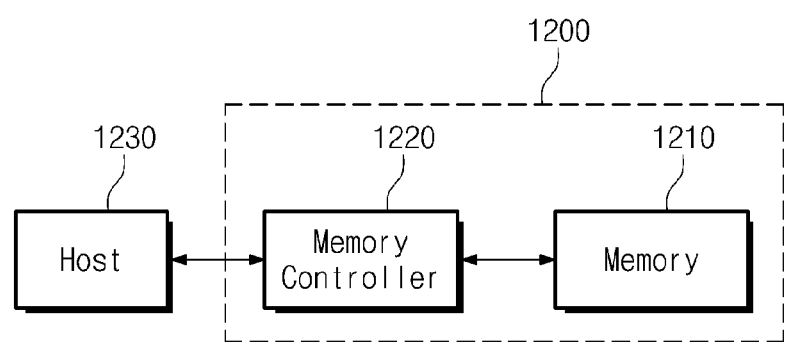
FIG. 13 is a schematic block diagram illustrating an example of a memory card including a semiconductor memory device according to an exemplary embodiment.

FIG. 13 is a schematic block diagram illustrating an example of memory cards including the semiconductor memory devices according to the exemplary embodiments of the inventive concept.

Referring to FIG. 13, a memory card 1200 according to exemplary embodiments of the inventive concept may include a memory 1210. The memory 1210 may include at least one of the semiconductor memory devices according to the afore-described exemplary embodiments of the inventive concept. In other exemplary embodiments, the memory 1210 may further include a semiconductor memory device, which is of a different type from the semiconductor memory devices according to the afore-described exemplary embodiments of the inventive concept. The memory card 1200 may include a memory controller 1220 that controls data communication between a host 1230 and the memory 1210.

According to exemplary embodiments of the inventive concept, in the process of forming the holes with high aspect ratio, the use of the first mask patterns with high selectivity makes it possible to increase the process margin. Further, the key mask patterns with high optical transmittance may be provided on peripheral circuit region, and this makes it easy to control the alignment and overlay between the upper and lower layers.

While exemplary embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, the method comprising:
forming an interlayer insulating layer on a structure having a cell region and a peripheral circuit region;
forming a first mask layer on the interlayer insulating layer;
forming trenches in the first mask layer exposing the interlayer insulating layer by patterning the first mask layer on the peripheral circuit region; and
forming key mask patterns in the trenches,
wherein an etch selectivity of the first mask layer with respect to the interlayer insulating layer is greater than an etch selectivity of the key mask patterns with respect to the interlayer insulating layer.

2. The method of claim 1, wherein the forming the key mask patterns comprises:
forming a second mask layer on the first mask layer to fill the trenches; and
planarizing the second mask layer to expose the first mask layer.

3. The method of claim 1, wherein an optical transmittance of the key mask patterns is higher than an optical transmittance of the first mask layer.

4. The method of claim 3, wherein the first mask layer comprises a metal layer.

5. The method of claim 4, wherein the first mask layer comprises at least one of Al, Sc, Ti, Cr, Ni, Cu, Zn, Zr, Mo, Ru, Hf, Ta, W, Pt, La, and alloys thereof.

6. The method of claim 3, wherein the key mask patterns are formed of a silicon layer.

7. The method of claim 6, wherein the key mask patterns are formed of a doped silicon layer.

8. The method of claim 1, wherein the forming the trenches comprises:
patterning the first mask layer to form first portions exposing a top surface of the interlayer insulating layer; and
etching an upper portion of the interlayer insulating layer exposed by the first portions to form second portions,
wherein bottom surfaces of the trenches are positioned below a bottom surface of the first mask layer.

9. The method of claim 1, wherein the key mask patterns are thicker than the first mask layer.

10. The method of claim 1, further comprising forming alignment keys and first overlay keys in the structure on the peripheral circuit region,
wherein the forming the trenches comprises removing portions of the first mask layer that are overlapped with the alignment keys and the first overlay keys.

11. The method of claim 1, further comprising forming alignment keys and first overlay keys in the structure on the peripheral circuit region,
wherein the key mask patterns are formed in such a way that they are overlapped with the alignment keys and the first overlay keys, when viewed in a plan view.

12. The method of claim 11, further comprising forming second overlay keys on the key mask patterns, wherein the second overlay keys are overlapped with the first overlay keys and are vertically spaced apart from the first overlay keys by the key mask patterns interposed therebetween.

13. The method of claim 1 further comprising, after the forming the key mask patterns:
    patterning the first mask layer of the cell region to form first mask patterns having openings exposing the interlayer insulating layer;
    etching the interlayer insulating layer using the first mask patterns as an etch mask to form holes exposing the structure; and
    removing the first mask patterns and the key mask patterns.

14. The method of claim 13, wherein the etching the interlayer insulating layer comprises etching the interlayer insulating layer under an etching condition capable of providing an etch selectivity with respect to the first mask patterns and the key mask patterns.

15. The method of claim 13, wherein the removing the first mask patterns and the key mask patterns comprises:
    forming sacrificial patterns to fill the holes;
    etching the first mask patterns and the key mask patterns to expose the interlayer insulating layer; and
    removing the sacrificial patterns.

16. A method of fabricating a semiconductor device, the method comprising:
    forming alignment keys and first overlay keys in a peripheral circuit region of a structure having a cell region and the peripheral circuit region;
    forming an interlayer insulating layer on the structure;
    forming a first mask layer on the interlayer insulating layer;
    forming trenches in the first mask layer exposing the interlayer insulating layer by patterning the first mask layer on the peripheral circuit region, wherein a location of the trenches corresponds to a location of the alignment keys and the first overlay keys, respectively;
    forming key mask patterns in the trenches, wherein the key mask patterns are overlapped with the alignment keys and the first overlay keys; and
    detecting the alignment keys on the structure through the key mask patterns to align a photoresist pattern to the structure.

17. The method of claim 16, wherein an etch selectivity of the first mask layer with respect to the interlayer insulating layer is greater than an etch selectivity of the key mask patterns with respect to the interlayer insulating layer.

18. The method of claim 16, wherein an optical transmittance of the key mask patterns is higher than an optical transmittance of the first mask layer.

19. The method of claim 16, wherein the cell region comprises memory cells and the peripheral circuit region comprises peripheral circuits for controlling the memory cells.

20. The method of claim 16, wherein the forming the key mask patterns comprises:
    forming a second mask layer on the first mask layer to fill the trenches; and
    planarizing the second mask layer to expose the first mask layer.

* * * * *